United States Patent
Miura et al.

(10) Patent No.: US 8,271,740 B2
(45) Date of Patent: Sep. 18, 2012

(54) MULTIPORT MEMORY AND INFORMATION PROCESSING SYSTEM

(75) Inventors: Seiji Miura, Chiyoda-ku (JP); Yoshinori Matsui, Chuo-ku (JP); Kazuhiko Abe, Chuo-ku (JP); Shoji Kaneko, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 340 days.

(21) Appl. No.: 12/411,974

(22) Filed: Mar. 26, 2009

(65) Prior Publication Data
US 2009/0248993 A1    Oct. 1, 2009

(30) Foreign Application Priority Data
Mar. 27, 2008   (JP) .................. 2008-084260

(51) Int. Cl.
*G06F 12/00* (2006.01)
(52) U.S. Cl. ................. 711/149; 711/E12.001
(58) Field of Classification Search ................. 711/149, 711/E12.001
See application file for complete search history.

(56) References Cited

U.S. PATENT DOCUMENTS
2006/0277372 A1* 12/2006 Wang et al. ................. 711/149

FOREIGN PATENT DOCUMENTS
JP        2007-35039 A    2/2007

OTHER PUBLICATIONS

"High-Speed 2.5V 512K + 36 Synchronous Dual-Port Static Ram with 3.3V or 2.5V Interface", Integrated Device Technology, Inc., May 2004, pp. 1-26.

* cited by examiner

*Primary Examiner* — Yong Choe
(74) *Attorney, Agent, or Firm* — Sughrue Mion, PLLC

(57) ABSTRACT

In an information processing system, a plurality of information processing devices CHIP0 and CHIP1 are connected to multiport memory MPMEM0 that has a plurality of ports, and memory areas in multiport memory MPMEM0 can be altered to memory areas occupied by particular ports and memory areas shared by a plurality of ports. At such times, immediately after the occurrence of a request from a port, the status of this request may be supplied from other ports.

18 Claims, 31 Drawing Sheets

| | TM-RG[7:0] |
|---|---|
| Read Cycle | 8 |

| | TM-RG[15:8] |
|---|---|
| Write Cycle | 8 |

SIG-RG

| | SIG-RG[0] |
|---|---|
| Read | 1 |

| | SIG-RG[1] |
|---|---|
| Write | 1 |

| | SA-RG[7:0] | | | | | | | |
|---|---|---|---|---|---|---|---|---|
| | 7 | 6 | 5 | 4 | 3 | 2 | 1 | 0 |
| SHARE | AREA7 | AREA6 | AREA5 | AREA4 | AREA3 | AREA2 | AREA1 | AREA0 |
| | 1 | 1 | 1 | 1 | 0 | 0 | 0 | 0 |

| | SA-RG[15:8] | | | | | | | |
|---|---|---|---|---|---|---|---|---|
| | 15 | 14 | 13 | 12 | 11 | 10 | 9 | 8 |
| P0AREA | AREA7 | AREA6 | AREA5 | AREA4 | AREA3 | AREA2 | AREA1 | AREA0 |
| | 0 | 0 | 0 | 0 | 0 | 0 | 1 | 1 |

| | SA-RG[23:16] | | | | | | | |
|---|---|---|---|---|---|---|---|---|
| | 23 | 22 | 21 | 20 | 19 | 18 | 17 | 16 |
| P1AREA | AREA7 | AREA6 | AREA5 | AREA4 | AREA3 | AREA2 | AREA1 | AREA0 |
| | 0 | 0 | 0 | 0 | 1 | 1 | 0 | 0 |

| | MS-RG[1:0] | | |
|---|---|---|---|
| | 1 | 0 | |
| PRT_MS | PRT1 | PRT0 | |
| | 0 | 0 | Round Robin : PRT0-1 |
| | 0 | 1 | Priority : PRT0>1 |
| | 1 | 0 | Priority : PRT1>0 |
| | 1 | 1 | Round Robin : PRT0,1 |

|  | ST-RG[3:0] |
|---|---|
| P0_Nop | 0 |
| P0_Read | 1 |
| P0_Write | 2 |

|  | ST-RG[7:4] |
|---|---|
| P0_Area | 7 |

|  | ST-RG[15:8] |
|---|---|
| P0_Cycle | 5 |

|  | ST-RG[19:16] |
|---|---|
| P1_Nop | 0 |
| P1_Read | 1 |
| P1_Write | 2 |

|  | ST-RG[23:20] |
|---|---|
| P1_Area | 3 |

|  | ST-RG[31:24] |
|---|---|
| P1_Cycle | 5 |

|  | I/O0[3:0] |
|---|---|
| P1_Nop | 0 |
| P1_Read | 1 |
| P1_Write | 2 |

|  | I/O0[7:4] |
|---|---|
| P1_Area | 7 |

|  | I/O0[15:8] |
|---|---|
| P1_Cycle | 5 |

I/O1

|  | I/O1[3:0] |
|---|---|
| P0_Nop | 0 |
| P0_Read | 1 |
| P0_Write | 2 |

|  | I/O1[7:4] |
|---|---|
| P0_Area | 6 |

|  | I/O1[15:8] |
|---|---|
| P0_Cycle | 5 |

Fig.18

DMD-RG

| Burst Length | DMD-RG[1:0] | BL |
|---|---|---|
| | 0 | 2 |
| | 1 | 4 |
| | 2 | 8 |
| | 3 | 16 |

| Read Latency | DMD-RG[4:2] | LAT |
|---|---|---|
| | 0 | 1 |
| | 1 | 2 |
| | 2 | 3 |
| | 3 | 4 |
| | 4 | 5 |
| | 5 | 6 |
| | 6 | 7 |
| | 7 | 8 |

| Write Latency | DMD-RG[7:5] | LAT |
|---|---|---|
| | 0 | 1 |
| | 1 | 2 |
| | 2 | 3 |
| | 3 | 4 |
| | 4 | 5 |
| | 5 | 6 |
| | 6 | 7 |
| | 7 | 8 |

Fig.19

DTM-RG

| | DTM-RG0[7:0] |
|---|---|
| BAtoR/W | 6 |

| | DTM-RG0[15:8] |
|---|---|
| PREtoBA | 6 |

| | DTM-RG1[7:0] |
|---|---|
| READ | LAT =< 4 : 4 + BL/2 |
| | LAT > 4 : LAT + BL/2 |

| | DTM-RG1[15:8] |
|---|---|
| WRITE | LAT =< 4 : 4 + BL/2 |
| | LAT > 4 : LAT + BL/2 |

| | DTM-RG2[7:0] |
|---|---|
| AUTOREF | 12 |

| | DTM-RG2[15:8] |
|---|---|
| BANKREF | 10 |

Fig.20

DSIG-RG

| | DSIG-RG[0] |
|---|---|
| BA | 1 |

| | DSIG-RG[1] |
|---|---|
| READ | 1 |

| | DSIG-RG[2] |
|---|---|
| WRITE | 1 |

| | DSIG-RG[3] |
|---|---|
| PRE | 1 |

| | DSIG-RG[4] |
|---|---|
| PREALL | 1 |

| | DSIG-RG[5] |
|---|---|
| BANKREF | 1 |

| | DSIG-RG[6] |
|---|---|
| AUTOREF | 1 |

Fig.21

DSB-RG

| | DSB-RG[7:0] | | | | | | | |
|---|---|---|---|---|---|---|---|---|
| | 7 | 6 | 5 | 4 | 3 | 2 | 1 | 0 |
| SHARE | BANK7 | BANK6 | BANK5 | BANK4 | BANK3 | BANK2 | BANK1 | BANK0 |
| | 1 | 1 | 1 | 1 | 0 | 0 | 0 | 0 |

| | DSB-RG[15:8] | | | | | | | |
|---|---|---|---|---|---|---|---|---|
| | 15 | 14 | 13 | 12 | 11 | 10 | 9 | 8 |
| P0BANK | BANK7 | BANK6 | BANK5 | BANK4 | BANK3 | BANK2 | BANK1 | BANK0 |
| | 0 | 0 | 0 | 0 | 0 | 0 | 1 | 1 |

| | DSB-RG[23:16] | | | | | | | |
|---|---|---|---|---|---|---|---|---|
| | 23 | 22 | 21 | 20 | 19 | 18 | 17 | 16 |
| P1BANK | BANK7 | BANK6 | BANK5 | BANK4 | BANK3 | BANK2 | BANK1 | BANK0 |
| | 0 | 0 | 0 | 0 | 1 | 1 | 0 | 0 |

Fig.22

DMS-RG

| | DMS-RG[1:0] | | |
|---|---|---|---|
| PRT_MS | 1 | 0 | |
| | DPT1 | DPT0 | |
| | 0 | 0 | Round Robin : DPT0-1 |
| | 0 | 1 | Priority : DPT0>1 |
| | 1 | 0 | Priority : DPT1>0 |
| | 1 | 1 | Round Robin : DPT0,1 |

| | DMS-RG[5:4] | | |
|---|---|---|---|
| REF_MS | 5 | 4 | |
| | DPT1 | DPT0 | |
| | 0 | 1 | Ref master : DPT0 |
| | 1 | 0 | Ref master : DPT1 |

Fig.23

DST-RG

|  | DST-RG[3:0] |
|---|---|
| P0_Nop | 0 |
| P0_Read | 1 |
| P0_Write | 2 |
| P0_BA | 3 |
| P0_Pre | 4 |
| P0_PreAll | 5 |
| P0_BkRef | 6 |
| P0_Ref | 7 |

|  | DST-RG[19:16] |
|---|---|
| P1_Nop | 0 |
| P1_Read | 1 |
| P1_Write | 2 |
| P1_BA | 3 |
| P1_Pre | 4 |
| P1_PreAll | 5 |
| P1_BkRef | 6 |
| P1_Ref | 7 |

|  | DST-RG[7:4] |
|---|---|
| P0_Area | 7 |

|  | DST-RG[23:20] |
|---|---|
| P1_Area | 6 |

|  | DST-RG[15:8] |
|---|---|
| P0_Cycle | 5 |

|  | DST-RG[31:24] |
|---|---|
| P1_Cycle | 5 |

| | I/O0[3:0] |
|---|---|
| P1_Nop | 0 |
| P1_Read | 1 |
| P1_Write | 2 |
| P1_BA | 3 |
| P1_Pre | 4 |
| P1_PreAll | 5 |
| P1_BkRef | 6 |
| P1_Ref | 7 |

I/O1

| | I/O1[3:0] |
|---|---|
| P0_Nop | 0 |
| P0_Read | 1 |
| P0_Write | 2 |
| P0_BA | 3 |
| P0_Pre | 4 |
| P0_PreAll | 5 |
| P0_BkRef | 6 |
| P0_Ref | 7 |

| | I/O0[7:4] |
|---|---|
| P1_Area | 7 |

| | I/O1[7:4] |
|---|---|
| P0_Area | 6 |

| | I/O0[15:8] |
|---|---|
| P1_Cycle | 5 |

| | I/O1[15:8] |
|---|---|
| P0_Cycle | 5 |

Fig.30

| MS-RG \ PRT_MS | MS-RG[3:0] | | | | |
|---|---|---|---|---|---|
| | 3 | 2 | 1 | 0 | |
| | PRT3 | PRT2 | PRT1 | PRT0 | |
| | 0 | 0 | 0 | 0 | Round Robin : PRT0-3 |
| | 0 | 0 | 0 | 1 | Priority : PRT0 > 1,2,3<br>Round Robin : PRT1,2,3 |
| | 0 | 0 | 1 | 0 | Priority : PRT1 > 0,2,3<br>Round Robin : PRT0,2,3 |
| | 0 | 0 | 1 | 1 | Prim : PRT0,1 > 2,3<br>Round Robin : PRT0,1<br>Round Robin : PRT2,3 |

Fig.31

DMS-RG

| | DMS-RG[3:0] | | | | |
|---|---|---|---|---|---|
| PRT_MS | 3 | 2 | 1 | 0 | |
| | DPT3 | DPT2 | DPT1 | DPT0 | |
| | 0 | 0 | 0 | 0 | Round Robin : DPT0-3 |
| | 0 | 0 | 0 | 1 | Priority : DPT0 > 1,2,3<br>Round Robin : DPT1,2,3 |
| | 0 | 0 | 1 | 0 | Priority : DPT1 > 0,2,3<br>Round Robin : DPT0,2,3 |
| | 0 | 0 | 1 | 1 | Prim : DPT0,1 > 2,3<br>Round Robin : DPT0,1<br>Round Robin : DPT2,3 |

| | DMS-RG[7:4] | | | | |
|---|---|---|---|---|---|
| REF_MS | 7 | 6 | 5 | 4 | |
| | DPT3 | DPT2 | DPT1 | DPT0 | |
| | 0 | 0 | 0 | 1 | Ref master : DPT0 |
| | 0 | 0 | 1 | 0 | Ref master : DPT1 |
| | 0 | 1 | 0 | 0 | Ref master : DPT2 |
| | 1 | 0 | 0 | 0 | Ref master : DPT3 |

MULTIPORT MEMORY AND INFORMATION PROCESSING SYSTEM

This application is based upon and claims the benefit of priority from Japanese patent Application No. 2008-084260 filed on Mar. 27, 2008, the disclosure of which is incorporated herein in its entirety by reference,

BACKGROUND OF THE INVENTION

1. Field of the Invention

The present invention relates to a multiport memory having a plurality of ports and to a control method of a multiport memory.

2. Description of the Related Art

The related art includes two-port memory equipped with a memory array configured from memory cells having two ports. In a two-port memory, simultaneous data reading from the same memory cell is enabled by the two ports (for example, see IDT 70T 3539M data sheet, Integrated Device Technology, Inc., May, 2004). Two-port DRAM having two ports also exists (for example, see JP-A-2007-35039).

The inventors of the present application previously investigated data communication methods between the ports of two-port SRAM.

In various information processing devices, two-port SRAM was used in data communication between the plurality of LSIs that make up an information processing device. A data communication method between the A-port (A-PRT) and B-port (B-PRT) in a two-port SRAM is next shown. INTA and INTB are signals corresponding to each port for reporting that information has been written to a Mail Box.

(1) A-PRT: The commencement of data writing from A-PRT and the start address are written to the Mail Box. INTB becomes "LOW."

(2) B-PRT: The transition of INTB to "LOW" reports the writing of information to the Mail Box. The information in the Mail Box is then read from B-PRT, whereby the writing of data from A-PRT and the start address are known. INTB becomes "HIGH."

(3) A-PRT: The data are written from A-PRT, and when data writing ends, completion of data writing and the final address are written to the Mail Box. INTB becomes "LOW."

(4) B-PRT: The writing of information to the Mail Box is known from the transition of INTB to "LOW." The information in the Mail Box is then read from B-PRT, data writing from A-PRT ends, and the end address of this data writing is further known. INTB becomes "High."

(5) B-PRT: The commencement of data reading from B-PRT and the start address are written to the Mail Box. INTA becomes "Low."

(6) A-PRT: The writing of information to the Mail Box is known from the transition of INTA to "Low." The information in the Mail Box is then read from A-PRT, and reading of data from B-PRT and the start address are known. INTA become "High."

(7) B-PRT: Data are read from B-PRT, and when completed, the completion of data reading and the end address are written to the Mail Box. INTA becomes "Low."

(8) A-PRT: The writing of data to the Mail Box is known from the transition of INTA to "Low." The information in the Mail Box is then read from A-PRT, the reading of data from B-PRT is completed, and further, the end address is known. INTA becomes "High."

In this way, writing and reading are carried out to and from a Mail Box in data communication between the A-port and the B-port of a two-port SRAM. Data communication is carried out by the so-called handshake method.

Data communication between A-port and B-port is thus delayed and obviously cannot cope with the higher speeds of an information processing system.

SUMMARY

A simple explanation follows below regarding the gist of a representative invention of the inventions disclosed in the present application.

As a summary of a representative invention, a plurality of information processing devices and a multiport memory having a plurality of ports are connected, and memory areas in the multiport memory can be altered between memory areas occupied by particular ports and the memory areas shared by a plurality of ports. At such times, immediately after the occurrence of a request from a port, the status of this request should be supplied immediately from the other ports.

A simple explanation follows below regarding the effects obtained by a representative form of the inventions disclosed in the present application.

The effects obtained by representative forms of the present invention include the ability to realize a multiport memory that increases the speed of data communication between a plurality of information processing devices and to provide an information processing system that is fast and easy to use.

BRIEF DESCRIPTION OF THE DRAWINGS

The above features and advantages of the present invention will be more apparent from the following description of certain preferred embodiments taken in conjunction with the accompanying drawings in which:

FIG. 6 is an explanatory view showing an example of registers (timing register, status notification signal register) in the multiport memory in the information processing system that is the first embodiment of the application of the present invention;

FIG. 7 is an explanatory view showing an example of a register (shared area register) in the multiport memory in the information processing system that is the first embodiment of the application of the present invention;

FIG. 8 is an explanatory view showing an example a register (master register) in the multiport memory in the information processing system that is the first embodiment of the application of the present invention;

FIG. 9 is an explanatory view showing an example of a register (status register) in the multiport memory in the information processing system that is the first embodiment of the application of the present invention;

FIG. 10 shows an example of the status information that is supplied from the input/output signal of the multiport memory in the information processing system that is the first embodiment of the application of the present invention;

FIG. 18 is an explanatory view showing an example of a register (mode register) in the multiport memory in the information processing system that is the second embodiment of the application of the present invention;

FIG. 19 is an explanatory view of a register (timing register) in the multiport memory in the information processing system that is the second embodiment of the application of the present invention;

FIG. 20 is an explanatory view showing an example of a register (status notification signal register) in the multiport memory in the information processing system that is the second embodiment of the application of the present invention;

FIG. 21 is an explanatory view showing an example of a register (shared bank register) in the multiport memory in the information processing system that is the second embodiment of the application of the present invention;

FIG. 22 is an explanatory view showing an example of a register (master register) in the multiport memory in the information processing system that is the second embodiment of the application of the present invention;

FIG. 23 is an explanatory view showing an example of a register (status register) in the multiport memory in the information processing system that is the second embodiment of the application of the present invention;

FIG. 24 shows an example of the status information that is supplied from an input/output signal of the multiport memory in the information processing system that is the second embodiment of the application of the present invention;

FIG. 30 is an explanatory view showing a modification of a register (master register) in the multiport memory in the information processing system that is the second embodiment of the application of the present invention; and FIG. 31 is an explanatory view showing a modification of a register (master register) in the multiport memory in the information processing system that is the second embodiment of the application of the present invention.

DETAILED DESCRIPTION OF THE PREFERRED EMBODIMENTS

Explanation next regards the details of embodiments of the present invention with reference to the accompanying drawings. Although no particular limitations apply, the circuit elements that make up each block in the embodiments are formed by integrated circuit technology such as known CMOS (Complementary MOS transistors) on a single semiconductor substrate such as single-crystal silicon.

First Embodiment

Explanation next regards the information processing system that is the first embodiment of the application of the present invention with reference to FIGS. 1 to 13.

Figure 1:
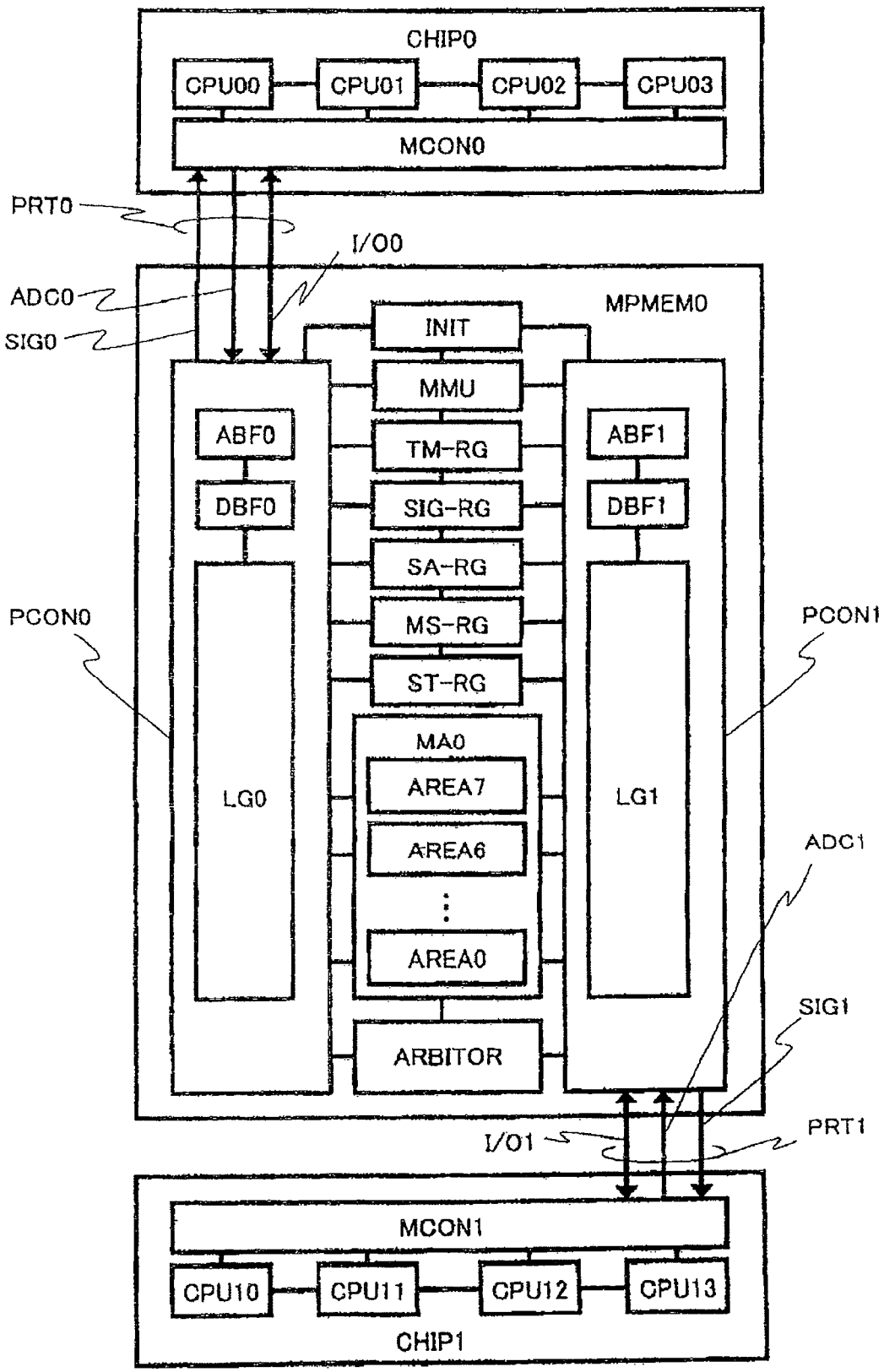
FIG. 1 is a block diagram showing an example of the configuration of the information processing system that is the first embodiment of the application of the present invention.

FIG. 1 shows the information processing system that is the first embodiment of the application of the present invention and is made up of information processing devices CHIP0 and CHIP1 and multiport memory MPMEM0. Each component is next explained.

Information processing device CHIP0 is made up of information processing circuits CPU00, CPU01, CPU02, and CPU03 and memory control circuit MCON0 Information processing device CHIP1 is made up of information processing circuits CPU10, CPU11, CPU12, and CPU13 and memory control circuit MCON1.

Information processing devices CHIP0 and CHIP1 are each connected to multiport memory MPMEM0 by way of memory control circuits MCON0 and MCON1, respectively, and carry out data communication with each other.

Multiport memory MPMEM0 is made up of: control circuits PCON0 and PCON1, initial setting circuit INIT, memory management circuit MMU, timing register TM-RG, status notification signal register SIG-RG, shared area register SA-RG, master register MS-RG, status register ST-RG, memory array MA0, and arbitration circuit ARBITOR.

Control circuit PCON0 is made up of: address buffer ABF0, data buffer DBF0, and control circuit LG0. Control circuit PCON1 is made up of: address buffer ABF1, data buffer DBF1, and control circuit LG1.

Although no particular limitations apply, memory array MA0 is made up of memory areas AREA0-AREA7. Memory array MA0 may be either a volatile memory or a non-volatile memory.

Signals ADC0 and ADC1 are a command and an address signal. Signals SIG0 and SIG1 are status notification signals. Signals I/O0 and I/O1 are data input/output signals.

When information processing device CHIP0 reads data that are held in memory array MA0 of multiport memory MPMEM0 by way of port PRT0, information processing device CHIP0 supplies read command READ0 and address ADD0 to multiport memory MPMEM0 via signal ADC0.

When information processing device CHIP1 reads data that are held in memory array MA0 of multiport memory MPMEM0 by way of port PRT1, information processing device CHIP1 supplies read command READ1 and address ADD1 to multiport memory MPMEM0 via signal ADC1.

When power is introduced to multiport memory MPMEM0, initial setting circuit INIT makes initial settings of all circuits in multiport memory MPMEM0. In memory management circuit MMU, timing register TM-RG, status notification signal register SIG-RG, shared area register SA-RG, master register MS-RG, status register ST-RG, and the address space of memory array MA0 are set.

Timing register TM-RG is a register for setting, for example, the time until completion of processing of reading and writing requests in multiport memory MPMEM0.

Status notification signal register SIG-RG is a register for designing the timing of transmitting status notification signals SIG0 and SIG1.

Shared area register SA-RG is a register for setting memory areas AREA0-AREA7 in memory array MA0 to shared areas of CHIP0 and CHIP1, occupied areas of CHIP0, and occupied areas of CHIP1.

Master register MS-RG is a register for, when requests from port PRT0 and port PRT1 are simultaneously issued to shared areas, determining which port's request is to be given priority.

Status register ST-RG is a register for holding the status of a request that is applied as input to multiport memory MPMEM0 by way of port 0 from CHIP0.

Arbitration circuit ARBITOR is a circuit for arbitrating requests applied as input from CHIP0 to multiport memory MPMEM0 by way of port 0 and requests applied as input from CHIP1 to multiport memory MPMEM0 by way of port 1.

The setting values in timing register TM-RG, status notification signal register SIG-RG, shared area register SA-RG, master register MS-RG, and status register ST-RG are altered by information processing device CHIP0 and information processing device CHIP1.

When information processing device CHIP0 reads the setting values that are held in each register of multiport memory MPMEM0 by way of port PRT0, information processing device CHIP0 supplies read command READ and address value ADD of each register via signal ADC0 to multiport memory MPMEM0.

On the other hand, when information processing device CHIP0 changes the setting values that are held in each register of multiport memory MPMEM0 by way of port PRT0, information processing device CHIP0 supplies multiport memory MPMEM0 with write command WRITE and address values ADD of each register via signal ADC0 and new setting data through signal I/O0.

When information processing device CHIP1 reads setting values that are held in each register of multiport memory MPMEM0 by way of port PRT1, information processing device CHIP1 supplies read command READ and address value ADD of each register via signal ADC1 to multiport memory MPMEM0.

On the other hand, when information processing device CHIP1 alters the setting values that are held in each register of multiport memory MPMEM0 by way of port PRT1, information processing device CHIP1 supplies multiport memory MPMEM0 with write command WRITE and address values ADD of each register via signal ADC1 and new setting data via signal I/O1.

Explanation next regards the operations of the present information processing system.

Explanation of Operations Immediately After Powering Up

Explanation first regards the operations of the present information processing system immediately after the introduction of the power supply.

When power is supplied to multiport memory MPMEM0, initial setting circuit INIT initializes all circuits in multiport memory MPMEM0.

Memory management circuit MMU is initialized and the initial address space of multiport memory MPMEM0 is set. Memory management circuit MMU is then altered when a memory management circuit MMU alteration command is received as input to command register REG in memory management circuit MMU.

The setting values of timing register TM-RG, status notification signal register SIG-RG, shared area register SA-RG, master register MS-RG, and status register ST-RG are set to the initial setting values.

Information processing device CHIP0 next alters the setting values of memory management circuit MMU, timing register TM-RG, status notification signal register SIG-RG, shared area register SA-RG, master register MS-RG, and status register ST-RG to satisfy the request of the information processing system.

In this way, memory management circuit MMU and each register can be set such that the request of the information processing system is satisfied immediately after the introduction of power, and the specifications of multiport memory MPMEM0 can therefore be flexibly altered according to requests from the information processing system that is used.

Explanation of Normal Operations

Explanation next regards data communication between information processing devices CHIP0 and CHIP1 and multiport memory MPMEM0 after the power-on sequence has been completed when power is introduced.

The following explanation regards data READ operations from multiport memory MPMEM0 when shared area register SA-RG has set, from among the memory areas AREA0-AREA7 in memory array MA0, memory area AREA0 and AREA1 as occupied areas of information processing device CHIP0, AREA2 and AREA3 as occupied areas of information processing device CHIP1, and AREA4 to AREA7 as the shared areas of information processing devices CHIP0 and CHIP1, although no particular limitations are here imposed.

In addition, although no particular limitation is implied, master register MS-RG is set to give priority to a request from port PRT0 when requests from port PRT0 and port PRT1 are simultaneously issued to a shared area.

Explanation first regards the operation of reading from memory area AREA0, which is an occupied area of information processing device CHIP0.

Read command READ and address value ADD0 are applied via signal ADC0 as input to multiport memory MPMEM0 from information processing device CHIP0.

Read command READ and address value ADD are applied as input to address buffer ABF0. Control circuit LG0 reads read command READ and address value ADD in address buffer ABF0, recognizes address value ADD that was received to be a read address with respect to memory area AREA0 that is an occupied area of information processing device CHIP0 by means of the setting the value of shared area register SA-RG and the address space that has been set memory management circuit MMU, and reads the data held in memory area AREA0.

The data that are read from memory area AREA0 are transmitted to information processing device CHIP0 via date buffer DBF0 and input/output signal I/O0.

Explanation next regards the operations of writing to memory area AREA0, which is an occupied area of information processing device CHIP0.

Write command WRITE and address value ADD0 are applied via signal ADC0 and write data from input/output signal I/O0 are applied as input to multiport memory MPMEM0 from information processing device CHIP0.

Write command WRITE and address value ADD are applied as input to address buffer ABF0 and the write data are applied as input to data buffer DBF0.

Control circuit LG0 reads the write command WRITE and address value ADD0 in address buffer ABF0 and the write data of data buffer DBF0, recognizes, by means of the setting values of shared area register SA-RG and the address space that was set by memory management circuit MMU, that the address value ADD0 received as input is a write address with respect to memory area AREA0 that is an occupied area of information processing device CHIP0, and writes the data to memory area AREA0.

Explanation next regards the operations for reading from memory area AREA2, which is an occupied area of information processing device CHIP1.

Read command READ and address value ADD2 are applied via signal ADC1 as input to multiport memory MPMEM0 from information processing device CHIP1.

Read command READ and address value ADD are applied as input to address buffer ABF1. Control circuit LG1 reads read command READ and address value ADD2 in address buffer ABF1, recognizes by means of the setting values of shared area register SA-RG and the address space that was set by memory management circuit MMU that address value ADD2 that was received is a read address with respect to memory area AREA2 that is an occupied area of information processing device CHIP1, and reads the data held in memory area AREA2.

The data that have been read from memory area AREA2 are transmitted to information processing device CHIP1 via data buffer DBF1 and input/output signal I/O1.

Explanation next regards the operations for writing to memory area AREA2, which is an occupied area of information processing device CHIP1.

Write command WRITE and address value ADD2 are applied via signal ADC1 and write data from input/output signal I/O1 are applied as input to multiport memory MPMEM0 from information processing device CHIP1.

Write command WRITE and address value ADD are applied as input to address buffer ABF1 and the write data are applied as input to data buffer DBF1.

Control circuit LG1 reads write command WRITE and address value ADD2 in address buffer ABF1 and the write data of data buffer DBF1, recognizes, by means of the setting values of shared area register SA-RG and the address space set by memory management circuit MMU, that address value ADD2 received as input is the write address to memory area AREA2 that is an occupied area of information processing device CHIP1, and writes the data to memory area AREA2.

Explanation next regards the operations when a request is generated to memory area AREA7 that is a shared area of information processing devices CHIP0 and CHIP1 from information processing device CHIP0.

Read command READ7 and address value ADD7 are applied via signal ADC0 as input to multiport memory MPMEM0 from information processing device CHIP0.

Read command READ and address value ADD7 are applied as input to address buffer ABF0. Control circuit LG0 reads read command READ and address value ADD7 in address buffer ABF0, recognizes, by means of the setting values of shared area register SA-RG and the address space that has been set by memory management circuit MMU, that address value ADD7 that has been received is a read address to memory area AREA7 that is a shared area of information processing devices CHIP0 and CHIP 1, and reads the data that are held in memory area AREA7.

The data that have been read from memory area AREA7 are transmitted to information processing device CHIP0 via data buffer DBF0 and input/output signal I/O0.

Control circuit LG0 further writes to status register ST-RG indication that a read command to memory area AREA7 has been issued at the same time that it notifies control circuit LG1 and timing register TM-RG.

Control circuit LG1 then makes signal SIG1 "High," and, by means of input/output signal I/O1, supplies a status signal indicating whether data reading has occurred with respect to memory area AREA7, and further, the extent of the time interval in which this data reading was executed.

In this way, information processing device CHIP1 is able to immediately detect the memory area in which access has occurred from information processing device CHIP0.

Explanation next regards operations when data writing occurs from information processing device CHIP0 to memory area AREA7, which is a shared area of information processing devices CHIP0 and CHIP1.

Write command READ7 and address value ADD7 are applied as input to multiport memory MPMEM0 via signal ADC0 from information processing device CHIP0.

Write command WRITE and address value ADD7 are applied as input to address buffer ABF0 and write data are applied as input to data buffer DBF0.

Control circuit LG0 reads write command WRITE and address value ADD7 in address buffer ABF0 and the write data from data buffer DBF0, recognizes, by means of the setting values of shared area register SA-RG and the address space set by memory management circuit MMU, that address value ADD7 that was received is the write address to memory area AREA7 that is a shared area of information processing devices CHIP0 and CHIP1, and writes the data to memory area AREA7.

Control circuit LG0 further writes to status register ST-RG that a read command to memory area AREA7 has occurred at the same time as reporting to control circuit LG1 and timing register TM-RG.

Control circuit LG1 then makes signal SIG1 "High," and supplies a status signal by means of input/output signal I/O1 indicating that writing to memory area AREA7 has been carried out and the extent of the time interval in which this data writing was executed.

In this way, information processing device CHIP1 can immediately sense the memory area to which access from information processing device CHIP0 has occurred.

Explanation next regards the operations when a read request to memory area AREA7, which is a shared area of information processing devices CHIP0 and CHIP1, occurs from information processing device CHIP1.

Read command READ7 and address value ADD7 are applied as input via signal ADC1 to multiport memory MPMEM0 from information processing device CHIP1.

Read command READ and address value ADD7 are applied as input to address buffer ABF1 Control circuit LG1 reads read command READ and address value ADD7 that are in address buffer ABF1, recognizes, by means of the setting values of shared area register SA-RG and the address space set by memory management circuit MMU, that address value ADD7 that was received is a read address to memory area AREA7 that is a shared area of information processing devices CHIP0 and CHIP1, and reads the data that are held in memory area AREA7.

The data that have been read from memory area AREA7 are transmitted to information processing device CHIP1 via data buffer DBF1 and input/output signal I/O1.

Control circuit LG1 further writes to status register ST-RG that a read command to memory area AREA7 has been generated at the same time as reporting to control circuit LG0 and timing register TM-RG.

Control circuit LG0 then sets signal SIG0 to "High," and then, by means of input/output signal I/O0, supplies a status signal indicating that a data reading has occurred to memory area AREA7 and the extent of the time interval in which this data reading is executed.

In this way, information processing device CHIP0 is able to immediately sense the memory area in which access from information processing device CHIP0 has occurred.

Explanation next regards the operations in the event of data writing from information processing device CHIP1 to memory area AREA7, which is a shared area of information processing devices CHIP0 and CHIP1.

Write command WRITE and address value ADD7 are applied as input to multiport memory MPMEM0 via signal ADC1 from information processing device CHIP1.

Write command WRITE and address value ADD7 are applied as input to address buffer ABF1 and write data are applied as input to data buffer DBF1.

Control circuit LG1 reads write command WRITE and address value ADD7 in address buffer ABF1 and the write data from data buffer DBF1, recognizes, by means of the setting values of shared area register SA-RG and the address space that was set by memory management circuit MMU, that address value ADD7 that was received as input is a write address to memory area AREA7 that is a shared area of information processing devices CHIP0 and CHIP1, and writes the data to memory area AREA7.

Control circuit LG1 further writes to status register ST-RG the occurrence of a read command to memory area AREA7 at the same time as reporting to control circuit LG0 and timing register TM-RG.

Control circuit LG0 then sets signal SIG0 to "High," and by means of input/output signal I/O0 supplies a status signal indicating that writing has been carried out to memory area AREA7 and the extent of the time interval in which this data writing was executed.

In this way, information processing device CHIP0 is able to sense immediately the memory area to which access occurred from information processing device CHIP1.

Explanation next regards operations when a request to write data from information processing device CHIP0 and a request to read data from CHIP1 are simultaneously generated to memory area AREA7, which is a shared area.

Write command WRITE and address value ADD7 from information processing device CHIP0 are applied as input via signal ADC0 to multiport memory MPMEM0.

At the same time, read command READ and address value ADD7 from information processing device CHIP1 are applied as input through signal ADC1 to multiport memory MPMEM0.

Write command WRITE and address value ADD7 are applied as input to address buffer ABF0. Control circuit LG0 reads write command WRITE and address value ADD7 in address buffer ABF0.

Read command READ and address value ADD7 are applied as input to address buffer ABF1. Control circuit LG1 reads read command READ and address value ADD7 in address buffer ABF1.

In accordance with the setting of master register MS-RG, the write request from information processing device CHIP0 is given priority, and control circuit LG0 writes the data to memory area AREA7.

Control circuit LG0 further writes to status register ST-RG the occurrence of the write command to memory area AREA7 at the same time as reporting to control circuit LG1 and timing register TM-RG.

Control circuit LG1 then sets signal SIG1 to "High," and by means of input/output signal I/O1, supplies a status signal indicating that data reading to memory area AREA7 has occurred, and further, indicates the completion time of this data reading (the time until the next command can be issued to the same memory area).

In this way, information processing device CHIP1 is able to immediately know that the read request from information processing device CHIP0 is being executed and that its own read request cannot be processed. Information processing device CHIP1 is further able to immediately know the completion time of the write request from information processing device CHIP0.

As a result, information processing device CHIP1 can immediately re-issue the read request to multiport memory MPMEM0 after completion of the completion time of the write request from information processing device CHIP0.

As described hereinabove, memory areas AREA0-AREA7 in memory array MA0 can be flexibly set to occupied areas and shared areas in accordance with the system by means of shared area register SA-RG.

In addition, by supplying status signals from signals SIG0 and SIG1 and input/output signals I/O0 and I/O1, the type, area, and time interval of the request being currently executed in multiport memory MPMEM0 can be known immediately and data communication between information processing device CHIP0 and information processing device CHIP1 can be carried out at high speed.

Explanation of Memory Map

Figure 2:
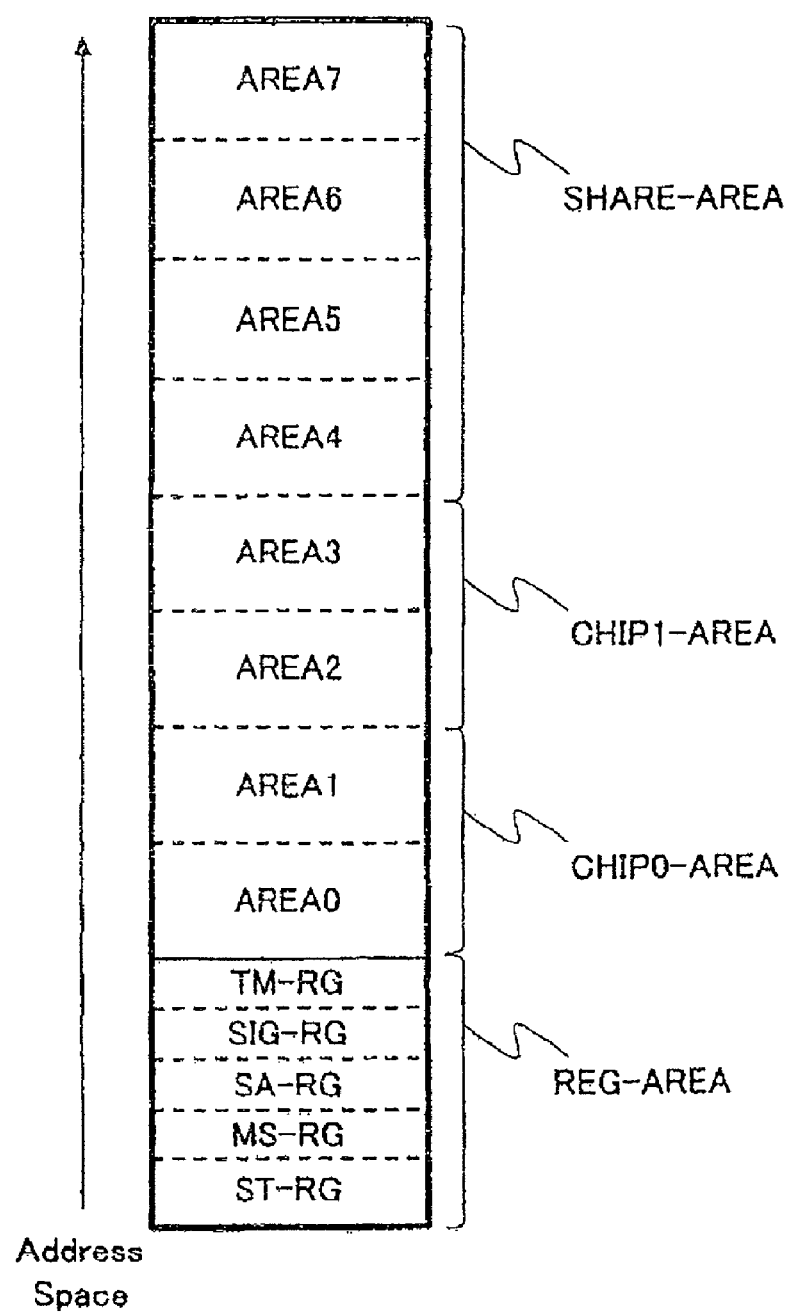
FIG. 2 is an explanatory view showing an example of the memory map of the multiport memory in the information processing system that is the first embodiment of the application of the present invention.

FIG. 2 shows an example of the memory map in multiport memory MPMEM0 that is set by shared area register SA-RG and memory management circuit MMU.

Although no particular limitation is implied, multiport memory MPMEM0 is a static random access memory that uses static random access memory cells and has a read time in the order of 15 ns.

Although no particular limitations are imposed, multiport memory MPMEM0 is divided into register area REG-AREA, occupied area CHIP0-AREA of information processing device CHIP0, occupied area CHIP1-AREA of information processing device CHIP1, and shared area SHARE-AREA of information processing device CHIP0 and information processing device CHIP1.

Register area REG-AREA is divided into status register ST-RG, master register MS-RG, shared area register SA-RG, status notification signal register SIG-RG, and timing register TM-RG.

Occupied area CHIP0-AREA is assigned to memory areas from AREA0 to AREA1, occupied area CHIP1-AREA is assigned to memory areas from AREA2 to AREA3, and shared area SHARE-AREA is assigned to memory areas AREA4 to AREA7.

As described above, memory areas AREA0-AREA7 in memory array MA0 can be flexibly set to occupied areas and shared areas by shared area register SA-RG and memory management circuit MMU.

Initial Sequence When Powering Up

Figure 3:
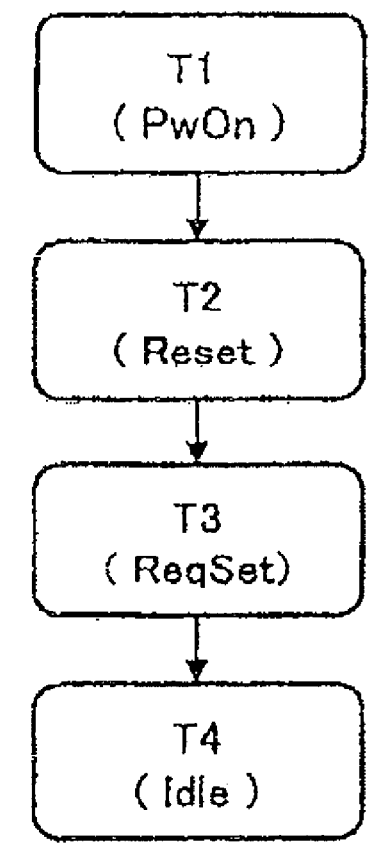
FIG. 3 shows an example of the operations when powering up the information processing system that is the first embodiment of the application of the present invention.

FIG. 3 shows the initial sequence at the time of supplying power to an information processing system that is made up of information processing device CHIP0, information processing device CHIP1, and multiport memory MPMEM0.

Power is supplied to multiport memory MPMEM0 in the interval of T1 (PwON) and resetting is carried out in the interval of T2 (Reset). Although no particular limitations apply to the method of resetting, a method may be carried out in which resetting is implemented automatically in each of the incorporated circuits, or an outside reset terminal may be included and the resetting operation then carried out by a reset signal to this terminal.

At this T2 interval (Reset), initial setting circuit INIT initializes memory management circuit MMU, timing register TM-RG, status notification signal register SIG-RG, shared area register SA-RG, master register MS-RG, and status register ST-RG.

By means of this initialization, the initial address space of multiport memory MPMEM0 is set in memory management circuit MMU, and initial setting values are set in timing register TM-RG, status notification signal register SIG-RG, shared area register SA-RG, master register MS-RG, and status register ST-RG.

In the T3 interval (ReqSet) in which reset is released, information processing device CHIP0 can carry out data writing to each register and change the initial setting values of the registers, although no particular limitation is here imposed.

After the T4 interval (Idle) that follows completion of the T3 interval, multiport memory MPMEM0 enters an idle state and enters a state of waiting for a request from information processing device CHIP0 and information processing device CHIP1.

Explanation of the Output of Status Information

Figure 4A:
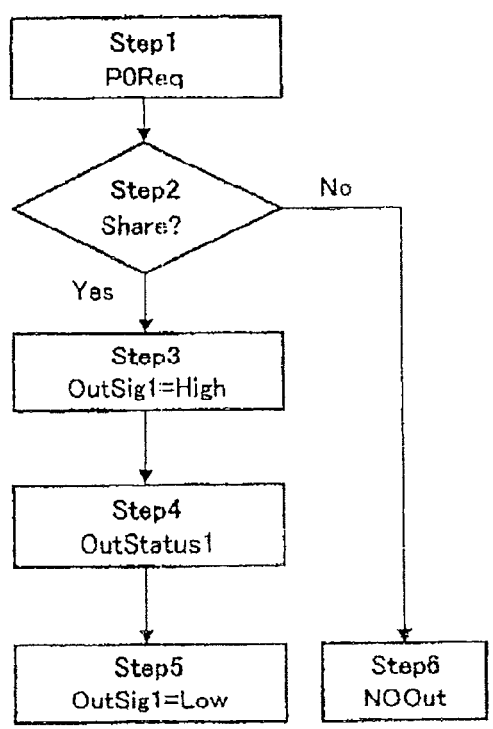
FIG. 4A is a flow chart showing an example of the status information output operation of the multiport memory in the information processing system that is the first embodiment of the application of the present invention.

FIG. 4A is a flow chart showing one example relating the output of signal SIG1 of multiport memory MPMEM0 and the status information output from input/output signal I/O1 when a request is issued to multiport memory MPMEM0 from information processing device CHIP0.

Figure 4B:
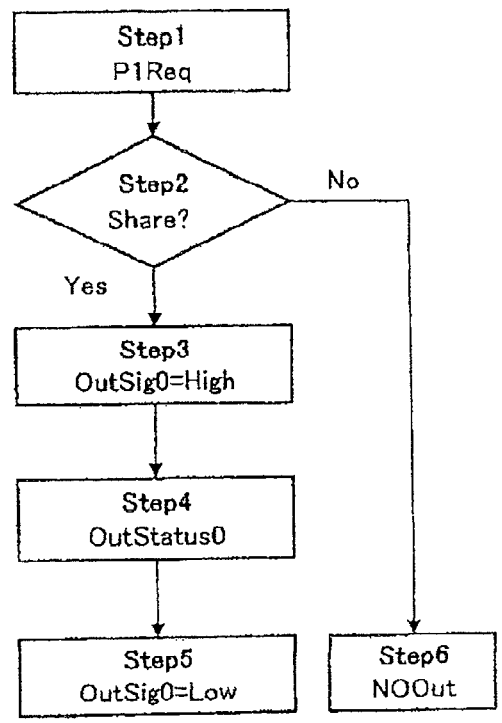
FIG. 4B is a flow chart showing an example of the status information output operation of the multiport memory in the information processing system that is the first embodiment of the application of the present invention.

FIG. 4B is a flow chart showing an example relating the output of signal SIG0 of multiport memory MPMEM0 and the status information output from input/output signal I/O0 when a request is issued to multiport memory MPMEM0 from information processing device CHIP1.

Explanation first regards FIG. 4A. When request P0Req is applied as input from information processing device CHIP0 to multiport memory MPMEM0 (Step 1), multiport memory MPMEM0 checks whether request P0Req is a request to a shared area (Step 2). If request P0Req is a request to a shared area, signal SIG1 becomes "High," and information processing device CHIP1 is notified that the request from information processing device CHIP0 is being executed. A status signal (command, area, completion time) relating to request P0Req is next supplied from input/output signal I/O1 (Step 4). Signal SIG1 then becomes "Low" (Step 5).

If request P0Req is not a request to a shared area, signal SIG1 remains unchanged at "Low," and a status signal is not supplied from input/output signal I/O1 (Step 6).

Explanation next regards FIG. 4B. When request P1Req is applied as input from information processing device CHIP1 to multiport memory MPMEM0 (Step 1), multiport memory MPMEM0 checks whether request P1Req is a request to a shared area (Step 2). If request P1Req is a request to a shared area, signal SIG0 becomes "High," and information processing device CHIP0 is notified that a request from information processing device CHIP1 is being executed (Step 3). A status signal (command, area, completion time) relating to request P1Req is then supplied from input/output signal I/O0 (Step 4). Signal SIG0 then becomes "Low" (Step 5).

If request P1Req is not a request to a shared area, signal SIG0 remains unchanged at "Low," and a status signal is not supplied from input/output signal I/O0 (Step 6).

Explanation of Access Arbitration

Figure 5:
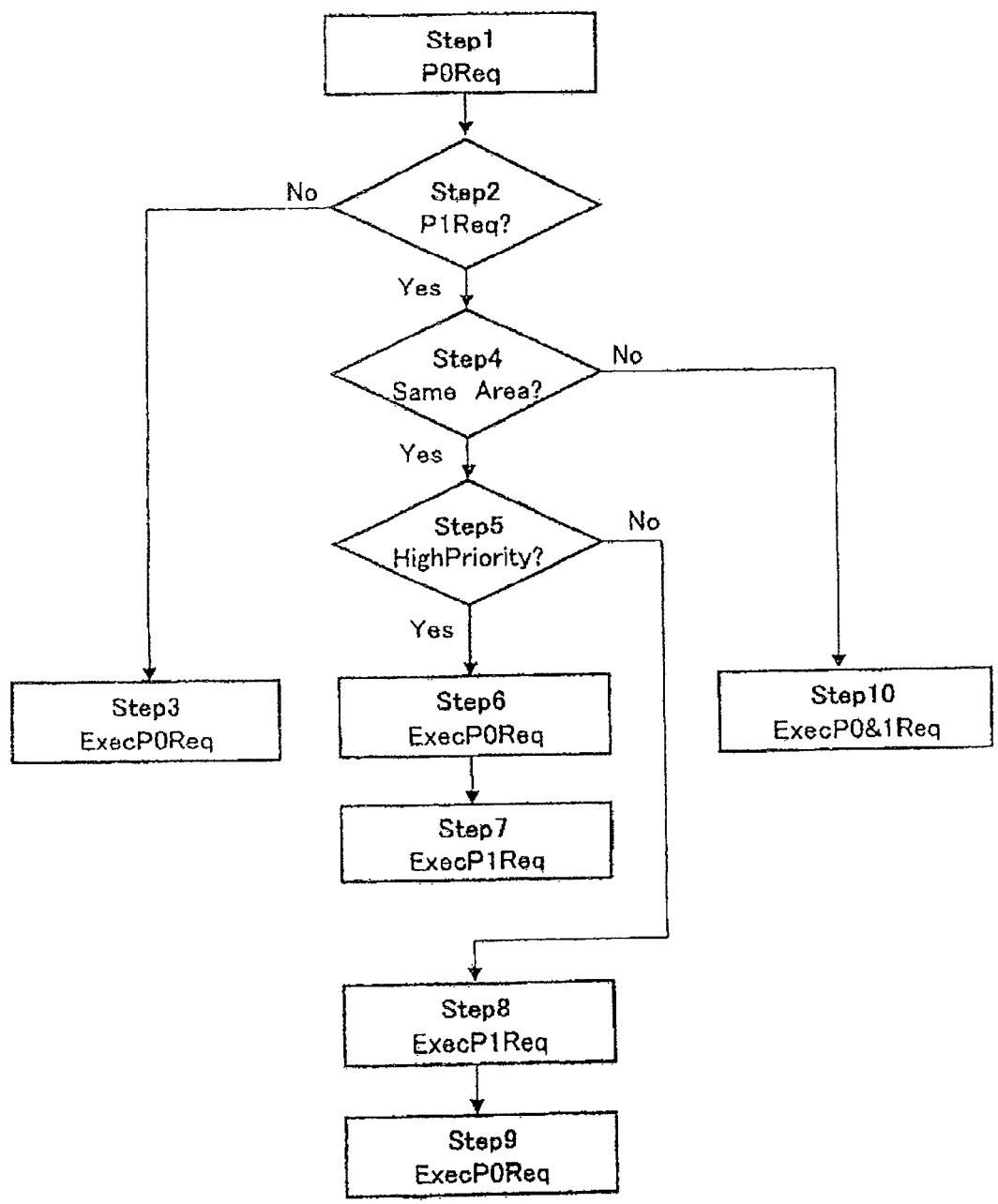
FIG. 5 is a flow chart of an example of the operation for issuing a request to the multiport memory in the information processing system that is the first embodiment of the application of the present invention.

FIG. 5 is a flow chart showing an example of the operations of multiport memory MPMEM0 when requests are issued to multiport memory MPMEM0 from information processing device CHIP0 and information processing device CHIP1.

When request P0Req is applied as input to multiport memory MPMEM0 from information processing device CHIP0 (Step 1), multiport memory MPMEM0 checks whether there is request P1Req from information processing device CHIP1 (Step 2). If there is no request P1Req, request P0Req is executed (Step 3). If there is request P1Req, multiport memory MPMEM0 checks whether request P0Req and request P1Req are requests to the same memory area (Step 4). If the requests are not to the same memory area, request P0Req and request P1Req are executed simultaneously (Step 10). If the requests are to the same memory area, multiport memory MPMEM0 checks the order of priority of request P0Req and request P1Req (Step 5). If the order of priority of request P0Req is higher, multiport memory MPMEM0 executes request P0Req (Step 6) and then executes request P1Req (Step 7). If the order of priority of request P1Req is higher, multiport memory MPMEM0 executes request P1Req (Step 8) and then executes request P0Req (Step 9).

Explanation of Registers

FIGS. 6 to 9 show examples of the setting values of registers in multiport memory MPMEM0.

Explanation of Timing Register TM-RG

FIG. 6 shows an example of timing register TM-RG.

Although no particular limitations apply, timing register TM-RG is made up of the 16 bits: TM-RG [15:0].

TM-RG [7:01] indicate the minimum cycle time from the start of data reading until a next request can be received, and although no particular limitation is here imposed, are set to 8 cycles.

TM-RG [15:8] indicate the minimum cycle time from the start of data writing until a next request can be received, and although no particular limitation is here imposed, are set to 8 cycles.

Explanation of Status Notification Signal Register SIG-RG

FIG. 6 shows an example of status notification signal register SIG-RG.

Status notification signal register SIG-RG is made up of the two bits SIG-RG [1:0], although no particular limitations apply.

SIG-RG [0] is a bit relating to data reading of a shared memory area, and is set to "1." This setting indicates that signal SIG1 becomes "High" when a read request from information processing device CHIP0 is issued to shared area, and that signal SIG0 becomes "High" when a read request from information processing device CHIP1 is issued to a shared area.

SIG-RG [1] is a bit relating to data writing to a shared area and is set to "1." This setting indicates that signal SIG1 becomes "High" when a write request from information processing device CHIP0 is issued to a shared area and that signal SIG0 becomes "High" when a read request is issued from information processing device CHIP1 to a shared area.

Explanation of Shared Area Register SA-RG

FIG. 7 shows an example of shared area register SA-RG.

Although no particular limitations apply, shared area register SA-RG is made up of the 24 bits SA-RG [23:0].

SA-RG [7:0] are bits for setting a shared memory area, SA-RG [15:8] are bits for setting an occupied memory area of information processing device CHIP0, and SA-RG [23:16] are bits for setting an occupied memory area of information processing device CHIP1.

Each bit of SA-RG [7:0] corresponds to a memory area from AREA7 to 0, and for example, when SA-RG [7] is "1," memory area AREA7 is a shared area.

Each bit of SA-RG [15:8] corresponds to a memory area from AREA7 to 0, and for example, when SA-RG [8] is "1," memory area AREA0 is an occupied area of information processing device CHIP0.

Each bit of SA-RG [23:16] corresponds to memory areas from AREA7 to 0, and for example, when SA-RG [19] is "1," memory area AREA3 is an occupied area of information processing device CHIP1.

In the example of FIG. 7, SA-RG [7:4] are all set to "1" and SA-RG [3:0] are all set to "0," whereby memory areas from AREA7 to 4 are shared areas.

In the example of FIG. 7, SA-RG [15:10] are all set to "0" and SA-RG [9:8] are all set to "1," whereby memory areas from AREA1 to 0 are occupied areas of information processing device CHIP0.

In the example of FIG. 7, SA-RG [23:20] are all set to "0," SA-RG [19:18] are all set to "1," and SA-RG [17:16] are all set to "0," whereby memory areas from AREA3 to 2 are occupied areas of information processing device CHIP1.

Explanation of Master Register MS-RG

FIG. 8 shows an example of master register MS-RG.

Master register MS-RG is made up of the two bits MS-RG [1:0], although no particular limitations apply.

Each bit of MS-RG [1:0] corresponds to each port of multiport memory MPMEME0. For example, MS-RG [0] corresponds to port 0 (PRT0) and MS-RG [1] corresponds to port 1 (PRT1).

As shown in the example of FIG. 8, when MS-RG [1] and MS-RG [0] are each set to "0," the order of priority of port 0 (PRT0) and port 1 (PRT1) changes according to a round-robin mode.

When MS-RG [1] is set to "0" and MS-RG [0] is set to "1," port 0 (PRT0) becomes the priority port.

When MS-RG [1] is set to "1" and MS-RG [0] is set to "0," port 1 (PRT1) becomes the priority port.

When MS-RG [1] and MS-RG [0] are each set to "1," the order of priority of port 0 (PRT0) and port 1 (PRT1) changes according to a round-robin mode.

Explanation of Status Register ST-RG

FIG. 9 shows an example of status register ST-RG.

Status register ST-RG is made up of the 32 bits of ST-RG [31:0], although no particular limitation is imposed.

ST-RG [15:0] stores status information (such as command, memory area, completion time) relating to requests from port 0 (PRT0) and ST-RG [31:16] stores status information (such as command, memory area, completion time) relating to requests from port 1 (PRT1).

ST-RG [3:0] holds commands currently being executed from port 0 (PRT0). ST-RG [3:0] indicates that no command is currently being executed when ST-RG [3:0] is "0," indicates that a read command is being executed when ST-RG [3:0] is "1," and indicates that a write command is currently being executed when ST-RG [3:0] is "2."

Although no limitation is imposed, ST-RG [3:0] is capable of holding 16 types of commands, and the commands that are held can be increased as necessary.

ST-RG [7:4] holds the memory area that is currently being accessed from port 0 (PRT0). When ST-RG [7:4] is "7," the occurrence of access to memory area AREA7 is indicated.

ST-RG [15:8] holds the completion time of the command that is currently being executed from port 0 (PRT0). When ST-RG [15:8] is "5," the completion of the command currently being executed after 5 cycles is indicated.

ST-RG [19:16] holds the command that is currently being executed from port 1 (PRT1). ST-RG [19:16] indicates that no command is currently being executed when ST-RG [19:16] is "0," indicates that a read command is currently being executed when ST-RG [19:16] is "1," and indicates that a write command is currently being executed when ST-RG [19:16] is "2."

Although no particular limitations apply, ST-RG [19:16] can hold 16 types of commands, and the commands that are held can be added as necessary.

ST-RG [23:20] holds the memory area that is currently being accessed from port 1 (PRT1). When ST-RG [23:20] is "3," the current occurrence of access to memory area AREA3 is indicated.

ST-RG [31:24] holds the completion time of a command that is currently being executed from port 1 (PRT1). When ST-RG [31:24] is "5," the completion of the command currently being executed in 5 cycles is indicated.

Explanation of Status Information Output from 110

FIG. 10 shows an example of status information (such as command, memory area, completion time) that is supplied as output from input/output signals I/O0 and I/O1 of multiport memory MPMEM0.

Input/output signal I/O0 supplies status information (such as command, memory area, completion time) for requests from port 1 (PRT1), and input/output signal I/O1 supplies status information (such as command, memory area, and completion time) for requests from port 0 (PRT0).

Although no particular limitations apply, input/output signal I/O0 is made up of the 16 bits of I/O0 [15:0], with I/O0 [3:0] indicating a command that is being executed, I/O0 [7:4] indicating the memory area that is being accessed, and I/O0 [15:8] indicating the completion time of the command that is being executed.

I/O0 [3:0], when "0," indicates that no command is currently being executed from port 1 (PRT1), indicates that a read command is currently being executed when "1," and indicates that a write command is being executed when "2."

I/O0 [7:4], when "7," indicates the current occurrence of access to memory area AREA7 from port 1 (PRT1).

I/O0 [15:8], when "5," indicates that the command currently being executed from port 1 (PRT1) will be completed after 5 cycles.

Although no particular limitations apply, input/output signal I/O1 is made up of the 16 bits I/O1 [15:0], with I/O1 [3:0] indicating the command that is being executed, I/O1 [7:4] indicating the memory area that is being accessed, and I/O1 [15:8] indicating the completion time of the command that is being executed.

I/O1 [3:0], when "0," indicates that no command is currently being executed from port 0 (PRT0), indicates that a read command is currently being executed when "1," and indicates that a write command is currently being executed when "2."

I/O1 [7:4], when "6," indicates that memory area AREA6 is currently being accessed from port 0 (PRT0).

I/O1 [15:8], when "5," indicates that the command currently being executed from port 0 (PRT0) will be completed in 5 cycles.

Explanation of Operating Waveform

Figure 11:
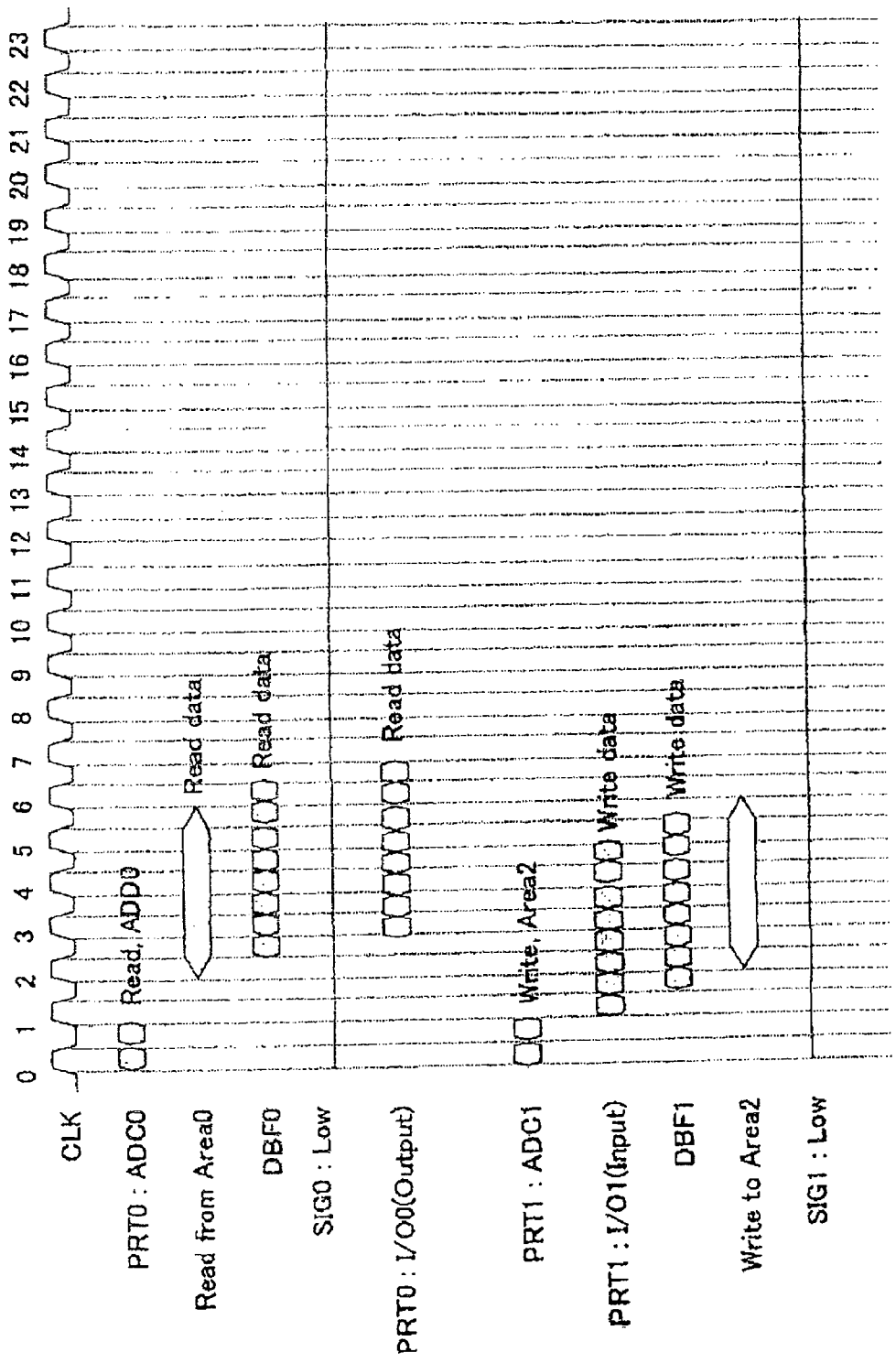
FIG. 11 shows an example of operating waveforms (reading and writing to each occupied area) in the information processing system that is the first embodiment of the application of the present invention.

FIG. 11 shows an example of the operating waveforms of multiport memory MPMEM0 when information processing device CHIP0 applies through port 0 (PRT0) a read request to memory area AREA0 that is an occupied area of information processing device CHIP0 of multiport memory MPMEM0, and when information processing device CHIP1 applies through port 1 (PRT1) a write request to memory area AREA2 that is an occupied area of information processing device CHIP1 of multiport memory MPMEM0.

Read request command READ and address value ADD0 are applied as input via signal ADC0 from information processing device CHIP0 to multiport memory MPMEM0 in synchronization with clock CLK.

By means of the read command READ and address value ADD0 that are received as input, the data that are held in memory area AREA0 that is an occupied area of information processing device CHIP0 are read (Read from Area 0).

The data that have been read from memory area AREA0 are transmitted to buffer DBF0 and supplied from input/output signal I/O0. When a request is applied as input to an occupied area of information processing device CHIP0, signal SIG1 remains unchanged as "Low" without becoming "High."

Write command WRITE and address value ADD2 are applied as input through signal ADC1 and write data WDATA2 are applied as input from input/output signal I/O1 to multiport memory MPMEM0 from information processing device CHIP1 in synchronization with clock CLK.

Memory area AREA2 that is an occupied area of information processing device CHIP1 is selected by write command WRITE and address value ADD2 that have been applied as input. Write data WDATA2 are transmitted to buffer DBF1 and then written to memory area AREA2 that has been selected.

When a request to an occupied area of information processing device CHIP1 is applied as input from information processing device CHIP1, signal SIG0 remains unchanged as "Low" without becoming "High."

In this way, access competition does not occur for requests to memory areas occupied by each of information processing devices CHIP0 and CHIP1, and each information processing device can therefore execute a request without interference from the request of the other information processing device. As a result, requests from each information processing device can be executed simultaneously to enable high-speed processing.

Although explanation in FIG. 11 regarded operations relating to a read request to port 0 (PRT0) and a write request to port 1 (PRT1), it goes without saying that operations relating to a write request to port 0 (PRT0) and a read request to port 1 (PRT1) are carried out similarly.

Figure 12:
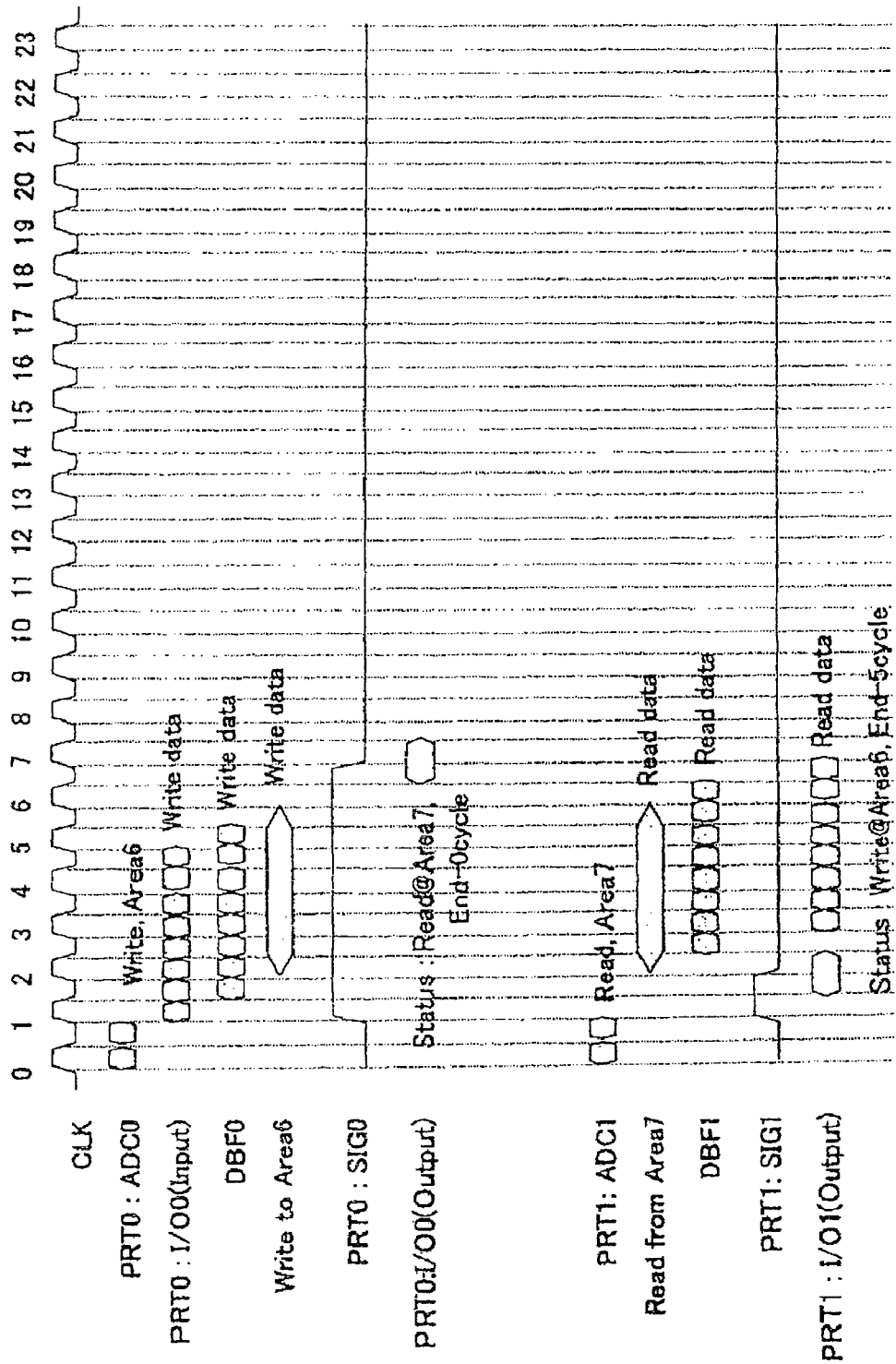
FIG. 12 shows an example of the operating waveforms (writing and reading to different shared areas) in the information processing system that is the first embodiment of the application of the present invention.

FIG. 12 shows an example of the operating waveforms of multiport memory MPMEM0 when information processing device CHIP0 issues write request WREQ0 through port 0 (PRT0) to memory area AREA6, which is a shared area of information processing devices CHIP0 and CHIP1 in multiport memory MPMEM0, and information processing device CHIP1 simultaneously issues read request RREQ1 through port 1 (PRT1) to memory area AREA7, which is a shared area of information processing devices CHIP0 and CHIP1 in multiport memory MPMEM0.

Write request WREQ0 (write command WRITE and address value ADD6 via signal ADC0 and write data WDATA6 from input/output signal I/O0) is applied in synchronization with clock CLK to multiport memory MPMEM0 from information processing device CHIP0.

Memory area AREA6, which is a shared area, is selected by means of the write command WRITE and address value ADD6 that are received as input. Write data WDATA6 are transmitted to buffer DBF0, and then written to memory area AREA6 that was selected.

When a request to a shared area is received as input from information processing device CHIP0, signal SIG1 becomes "High," and notification that a request from information processing device CHIP0 is being executed is sent to information processing device CHIP1. A status signal relating to the request (write command WRITE, memory area AREA6, completion time of 5 cycles) is next supplied from input/output signal I/O1. By means of this status signal, information processing device CHIP1 is able to know the actual content of the request from information processing device CHIP0. After output of the status signal from input/output signal I/O1, signal SIG1 becomes "Low."

Information processing device CHIP1 can save the status signal from this input/output signal I/O1 in its own memory control circuit MCON1 and can acquire the actual content of the request that is being executed in multiport memory MPMEM0 by information processing device CHIP0.

Read request RREQ1 (read command READ and address value ADD7 via signal ADC1) is applied as input to multiport memory MPMEM0 from information processing device CHIP1 in synchronization with clock CLK.

By means of read command READ and address value ADD7 that are received as input, the data that are held in memory area AREA7 that is a shared area are read (Read from Area7).

The data that have been read from memory area AREA7 are transmitted to buffer DBF1, and supplied from input/output signal I/O1.

When a request to a shared area is received as input from information processing device CHIP1, signal SIG0 becomes "High," and notification that a request from information processing device CHIP1 is being executed is sent to information processing device CHIP0. A status signal relating to the request (read command READ, memory area AREA7, completion time 0 cycles) is next supplied from input/output signal I/O0. By means of this status signal, information processing device CHIP0 is able to know the actual content of the request from information processing device CHIP1. After the output of the status signal from input/output signal I/O0, signal SIG0 becomes "Low."

Information processing device CHIP0 saves the status signal from this input/output signal I/O0 to its own memory control circuit MCON0 and is able to acquire the actual content of the request that is being executed in multiport memory MPMEM0 by information processing device CHIP1.

In this way, each of information processing devices CHIP0 and CHIP1 is able to execute requests without the occurrence of access competition and without interfering with the request of the other information processing device even when the requests are made to shared memory areas of the information processing devices, as long as the requests are made to different memory areas. As a result, requests from each information processing device can be executed simultaneously and high-speed processing is possible.

When a request to a shared memory area is generated from information processing device CHIP0, signal SIG1 becomes "High," and information processing device CHIP1 is able to know the actual content of a request from information processing device CHIP0 by means of a status signal from input/output signal I/O1. As a result, information processing device CHIP1 can issue an optimum request to multiport memory MPMEM0 in the shortest time interval. In addition, the actual content of the request of information processing device CHIP0 is saved in information processing device CHIP1, whereby information processing device CHIP1 is able to determine the type of request that should be supplied.

In addition, when a request to a shared memory area is generated from information processing device CHIP1, signal SIG0 becomes "High," and information processing device CHIP0 is able to know the actual content of the request from information processing device CHIP1 by means of a status signal from input/output signal I/O0. As a result, information processing device CHIP0 can issue the optimum request to multiport memory MPMEM0 in the minimum time interval. Further, the actual content of the request of information processing device CHIP1 is saved in information processing device CHIP0, whereby information processing device CHIP0 is able to determine the type of request that should be supplied.

In addition, although explanation in FIG. 12 regards operations relating to a write request to port 0 (PRT0) and a read request to port 1 (PRT1) to memory areas that are shared areas and different areas of information processing devices CHIP0 and CHIP1, it will be obvious that operations relating to all requests to port 0 (PRT0) and all requests to port 1 (PRT1) are carried out similarly.

Figure 13:
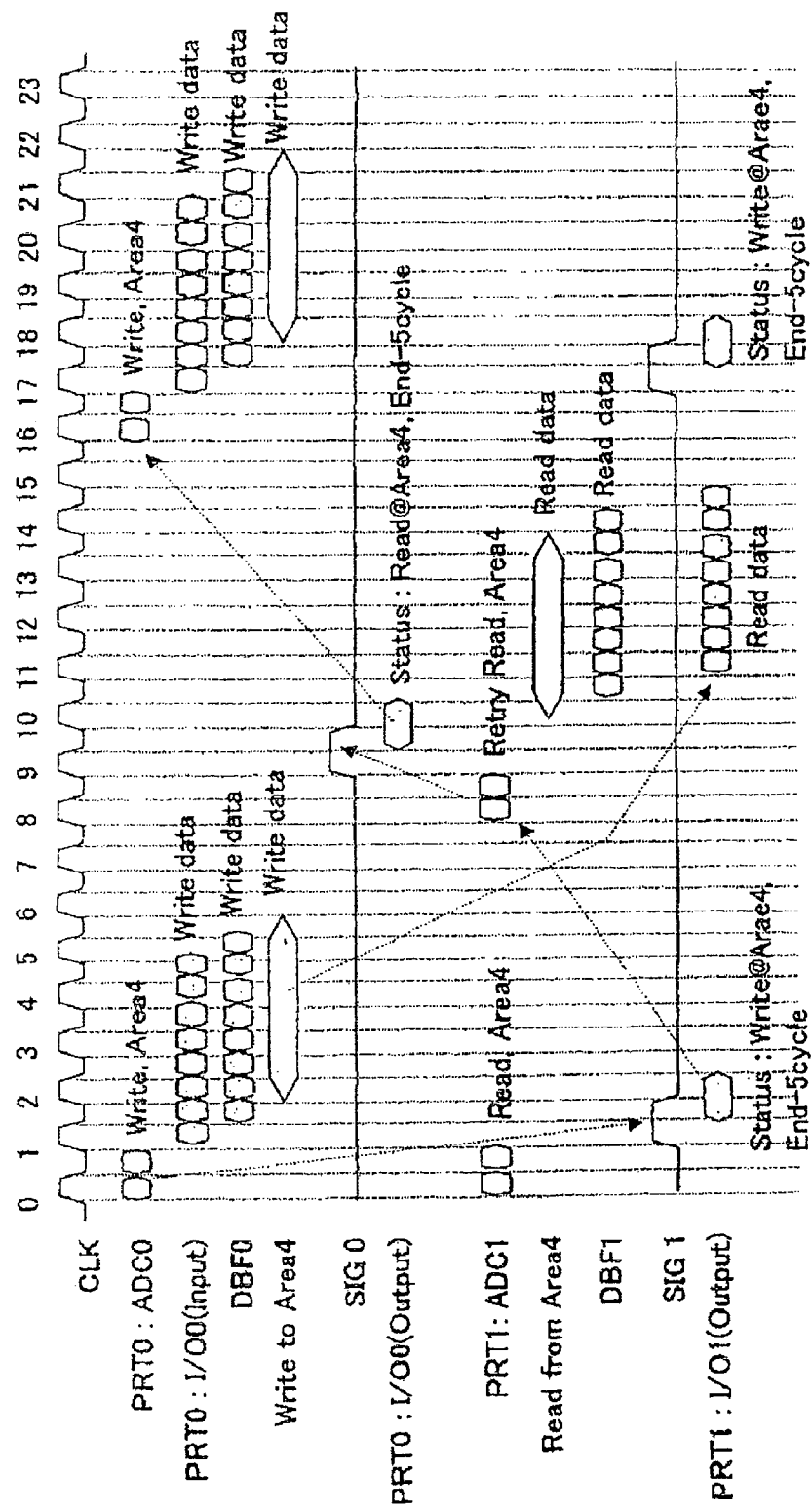
FIG. 13 shows an example of operating waveforms (writing and reading to the same shared area) in the information processing system that is the first embodiment of the application of the present invention.

FIG. 13 shows an example of operating waveforms relating to a case in which information processing device CHIP0 writes data WDATA4 to memory area AREA4 that is a shared area of multiport memory MPMEM0 through port 0 (PRT0) and information processing device CHIP1 reads data WDATA4 that have been written to memory area AREA4 through port 1 (PRT1), i.e., relating to data communication between information processing devices CHIP0 and CHIP1.

Write request WREQ0 (write command WRITE and address value ADD4 via signal ADC0 and write data WDATA4 from input/output signal I/O0) is applied as input to multiport memory MPMEM0 from information processing device CHIP0 in synchronization with clock CLK.

In addition, read request RREQ1 (read command READ and address value ADD4 via signal ADC1) is simultaneously applied as input to multiport memory MPMEM0 from information processing device CHIP1 in synchronization with clock CLK.

When requests are received at the same time from information processing device CHIP0 and information processing device CHIP1, access from port 0 (PRT0) is given priority by arbitration circuit ARBITOR, whereby memory area AREA4 that is a shared area is selected by write command WRITE and address value ADD4 that were received.

When the request to the shared area is received as input from information processing device CHIP0, signal SIG1 becomes "High," and notification that the request from information processing device CHIP0 is being executed is sent to information processing device CHIP1. A status signal relating to the request (write command WRITE, memory area AREA4, completion time of 5 cycles) is next supplied from input/output signal I/O1. After the output of the status signal from input/output signal I/O1, signal SIG1 becomes "Low."

Information processing device CHIP1 saves this status signal from input/output signal I/O1 in its own memory control circuit MCON1 and is thus able to acquire the actual content of the request that is being executed in multiport memory MPMEM0 by information processing device CHIP0.

Information processing device CHIP1 knows from the change of signal SIG1 to "High" that a request to a shared area has been generated from information processing device CHIP0, and by saving the actual content that is contained in the status signal from input/output signal I/O1, knows that information processing device CHIP0 will complete data writing to memory area AREA4 after five clock cycles.

In this way, information processing device CHIP1 knows that the first read request RREQ1 is not executed, and after the write operations of information processing device CHIP0 are completed, immediately re-applies read request RREQ2 (read command READ and address value ADD4 through signal ADC1) to multiport memory MPMEM0.

By means of the read command READ and address value ADD4 that are applied as input, the data that are held in memory area AREA4 that is a shared area (data WDATA4 that were just written by information processing device CHIP0) are read (Read from Area 4). The data that are read from memory area AREA4 are supplied from input/output signal I/O1.

When a request to a shared area is received as input from information processing device CHIP1, signal SIG0 becomes "High," and notification that a request from information processing device CHIP1 is being executed is sent to Information processing device CHIP0. A status signal relating to the request (read command READ, address value ADD4, and completion time of 5 cycles) is next supplied from input/output signal I/O0. After output of the status signal from input/output signal I/O0, signal SIG0 becomes "Low."

Information processing device CHIP0 saves the status signal from this input/output signal I/O0 in its own memory control circuit MCON0 and thus is able to acquire the actual content of the request that is being executed in multiport memory MPMEM0 by information processing device CHIP1.

Information processing device CHIP0 knows from the change of signal SIG0 to "High" that a request to a shared area has been generated from information processing device CHIP1, and further, by saving the actual content of the request that is contained in the status signal from input/output signal I/O0, knows that information processing device CHIP1 will complete the data reading from memory area AREA4 after five cycles.

In this way, information processing device CHIP0 applies write request WREQ2 (write command WRITE and address value ADD4 via signal ADC1 and write data WDATA4 from input/output signal I/O0) to multiport memory MPMEM0 immediately after completion of the read operations of information processing device CHIP1.

Memory area AREA4 that is a shared area is selected by means of the write command WRITE and address value ADD4 that have been received as input. Write data WDATA4 are transmitted to buffer DBF0 and then written to memory area AREA4 that was selected.

As described in the foregoing explanation, data communication between information processing devices CHIP0 and CHIP1 can be realized at high speed because information processing devices CHIP0 and CHIP1 can know the actual content of the requests that each are executing (command, memory area, completion time) by means of status signals from input/output signals I/O0 and I/O1.

Second Embodiment

Explanation next regards an information processing system that is the second embodiment of the application of the present invention with reference to FIGS. 14-29.

Figure 14:
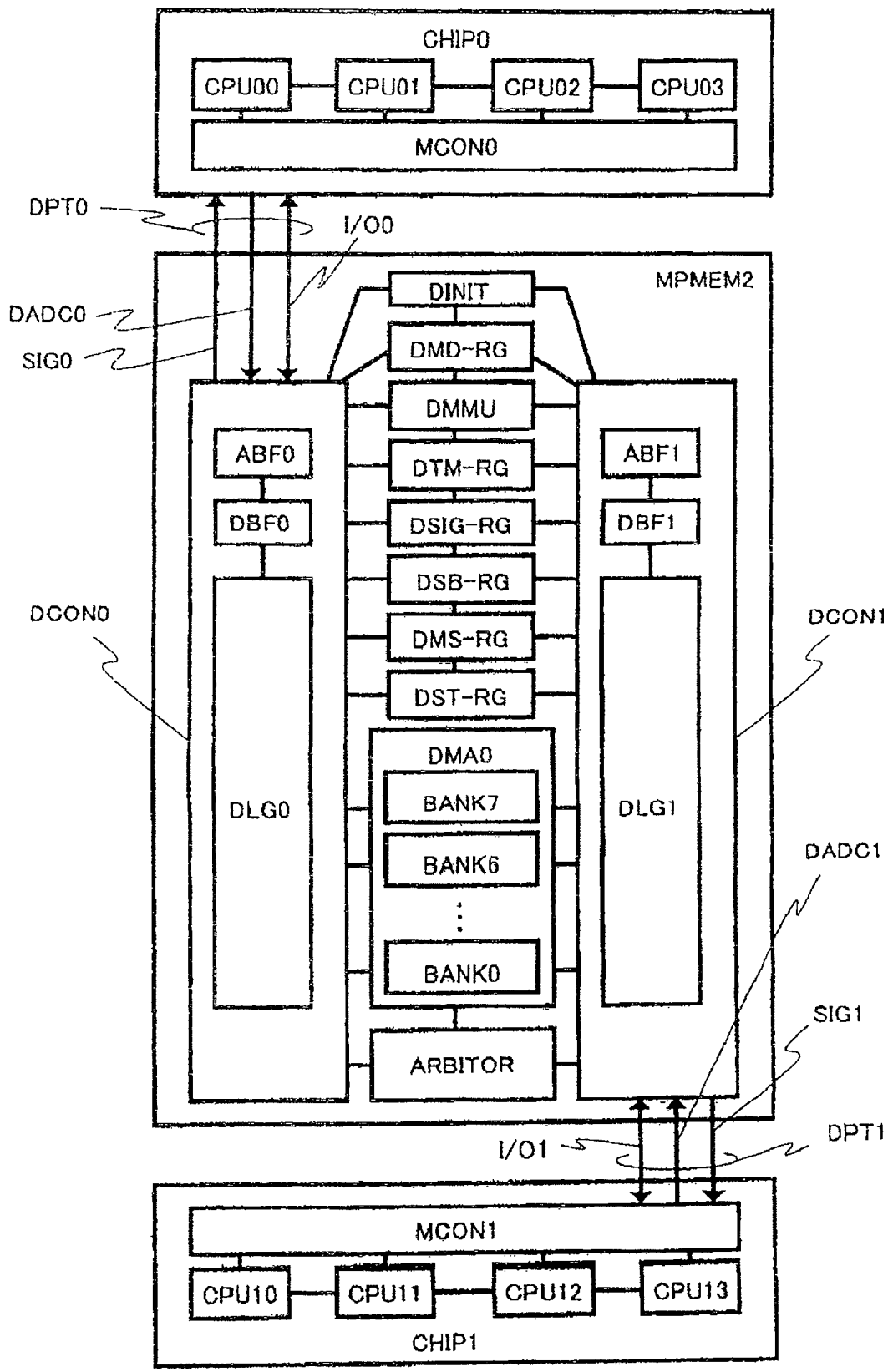
FIG. 14 is a block diagram showing an example of the configuration of the information processing system that is the second embodiment of the application of the present invention.

FIG. 14 shows an information processing system that is the second embodiment of the application of the present invention and that is made up of information processing devices CHIP0 and CHIP1 and multiport memory MPMEM2.

Information processing device CHIP0 is made up of information processing circuits CPU00, CPU01, CPU02, and CPU03, and memory control circuit MCON0. Information processing device CHIP1 is made up of information processing circuits CPU10, CPU11, CPU12, and CPU13 and memory control circuit MCON1.

Reading of an OS, application programs, and data for carrying out processing in application programs from multiport memory MPMEM2 is executed through memory control circuit MCON0 in information processing circuits CPU00, CPU01, CPU02, and CPU03 and through memory control circuit MCON1 in information processing circuits CPU10, CPU11, CPU12, and CPU13.

Information processing devices CHIP0 and CHIP1 are connected to multiport memory MPMEM2 by way of memory control circuits MCON0 and MCON1 and carry out data communication with each other.

Multiport memory MPMEM2 is made up of: control circuits DCON0 and DCON1, initial setting circuit DINIT, mode register DMD-RG, memory management circuit DMMU, timing register DTM-RG, status notification signal register DSIG-RG, shared bank register DSB-RG, master register DMS-RG, status register DST-RG, memory array DMA0, and arbitration circuit ARBITOR.

Control circuit DCON0 is made up of: address buffer ABF0, data buffer DBF0, and control circuit DLG0. Control circuit DCON1 is made up of address buffer ABF1, data buffer DBF1, and control circuit DLG1.

Although no particular limitation is implied, memory array DMA0 is composed of memory banks BANK0-BANK7 and is made up of memory cells of dynamic random access memory.

Signals DADC0 and DADC1 are command and address signals. Signals SIG0 and SIG1 are status notification signals. Input/output signals I/O0 and I/O1 are data input/output signals.

Explanation next regards an example of operations when information processing device CHIP0 reads data saved to memory array DMA0 of multiport memory MPMEM2 by way of port DPT0.

Information processing device CHIP0 supplies bank-active command BA0, bank address BADD0, and row address RADD0 via signal DADC0 to multiport memory MPMEM2. By means of this bank-active command BA0, the 8192-bit portion of memory cells that are connected to row address 0 in memory bank BANK0 is activated and transferred to a sense amplifier.

Read command RD0, bank address BADD0, and column address CADD0 are next supplied to multiport memory MPMEM2 via signal DADC0. By means of this read command RD0, among the data that are saved in the sense amplifier in memory bank BANK0, the 16-byte portion of data that have column address 0 as a start address are read, transferred to data buffer DBF0, and transferred by way of input/output signal I/O0 to information processing device CHIP0.

Explanation next regards an example of the operations when information processing device CHIP1 reads data that are stored to memory array DMA0 of multiport memory MPMEM2 by way of port DPT1.

Information processing device CHIP1 supplies bank-active command BA2, bank address BADD2, and row address RADD0 via signal DADC1 to multiport memory MPMEM2. By means of this bank-active command BA2, the 8192-bit portion of memory cells that are connected to row address 0 in memory bank BANK2 is activated and transferred to the sense amplifier.

Read command RD2, bank address BADD2, and column address CADD0 are next supplied to multiport memory MPMEM2 via signal DADC1.

By means of this read command RD2, among the data that are saved in the sense amplifier in memory bank BANK2, the 16-byte portion of data having column address 0 as a start address are read, transferred to data buffer is DBF1, and transferred to information processing device CHIP1 by way of input/output signal I/O1.

Upon the introduction of power to multiport memory MPMEM2, initial setting circuit DINIT initializes the settings of all circuits in multiport memory MPMEM2.

The setting values in mode register DMD-RG, timing register DTM-RG, status notification signal register DSIG-RG, shared bank register DSB-RG, master register DMS-RG, and status register DST-RG are initialized by initial setting circuit DINIT and subsequently altered by information processing device CHIP0 and information processing device CHIP1.

In memory management circuit DMMU, mode register DMD-RG, timing register DTM-RG, status notification signal register DSIG-RG, shared bank register DSB-RG, master register DMS-RG, and status register DST-RG are registers for setting the address space of memory array DMA0, are initialized by initial setting circuit DINIT, and are subsequently altered by information processing device CHIP0 or information processing device CHIP1.

Timing register DTM-RG is a register for setting, for example, the time until the processing of read requests and write requests in multiport memory MPMEM2 are completed, is initialized by initial setting circuit DINIT, and is subsequently altered by information processing device CHIP0 or information processing device CHIP1.

Status notification signal register DSIG-RG is a register for designing the timing of transmitting status notification signals SIG0 and SIG1, is initialized by initial setting circuit DINIT, and is subsequently altered by information processing device CHIP0 and information processing device CHIP1.

Shared bank register DSB-RG is a register for setting memory banks BANK0-BANK7 in memory array DMA0 to the shared memory banks of CHIP0 and CHIP1, the occupied memory banks of CHIP0, and the occupied memory banks of CHIP1; is initialized by initial setting circuit DINIT, and is subsequently altered by information processing device CHIP0 and information processing device CHIP1.

Status register DST-RG is a register for saving the status of requests that are applied as input from CHIP0 to multiport memory MPMEM2 by way of port 0, is initialized by initial setting circuit DINIT, and is subsequently altered by information processing device CHIP0 or information processing device CHIP1.

Mode register DMD-RG is a register for determining the read and write latency or burst length, is initialized by initial setting circuit DINIT, and is subsequently altered by information processing device CHIP0 or information processing device CHIP1.

Master register DMS-RG is a register for determining, among port DPT0 and port DPT1, the port that is to accept a refresh request and the port that is to accept commands for changing the values of all other registers, and, when requests from port DPT0 and port DPT1 are simultaneously issued to shared areas, for determining which port's request is to be given priority.

Master register DMS-RG is initialized by initial setting circuit DINIT and is subsequently altered by information processing device CHIP0 or information processing device CHIP1.

Arbitration circuit ARBITOR is a circuit for arbitrating requests that are applied from CHIP0 as input to multiport memory MPMEM2 by way of port DPT0 and requests that are applied from CHIP1 as input to multiport memory MPMEM2 by way of port DPT1.

When information processing device CHIP0 reads setting values that are saved to each register of multiport memory MPMEM2 by way of port DPT0, information processing device CHIP0 supplies read command READ and address value ADD of each register via signal DADC0 to multiport memory MPMEM2.

In addition, when information processing device CHIP0 changes the setting values that are saved to each register of multiport memory MPMEM2 by way of port DPT0, information processing device CHIP0 supplies write command WRITE and address values ADD of each register via signal DADC0 and new setting data through signal I/O0 to multiport memory MPMEM2.

When information processing device CHIP1 reads setting values that are saved to each register of multiport memory MPMEM2 by way of port DPT1, information processing device CHIP1 supplies read command READ and address values ADD of each register via signal DADC1 to multiport memory MPMEM2.

In addition, when information processing device CHIP1 alters the setting values that are saved to each register of multiport memory MPMEM2 by way of port DPT1, information processing device CHIP1 supplies write command WRITE and address values ADD of each register via signal DADC1 and new setting data through signal I/O1 to multiport memory MPMEM2.

Explanation of Memory Map

Figure 15:
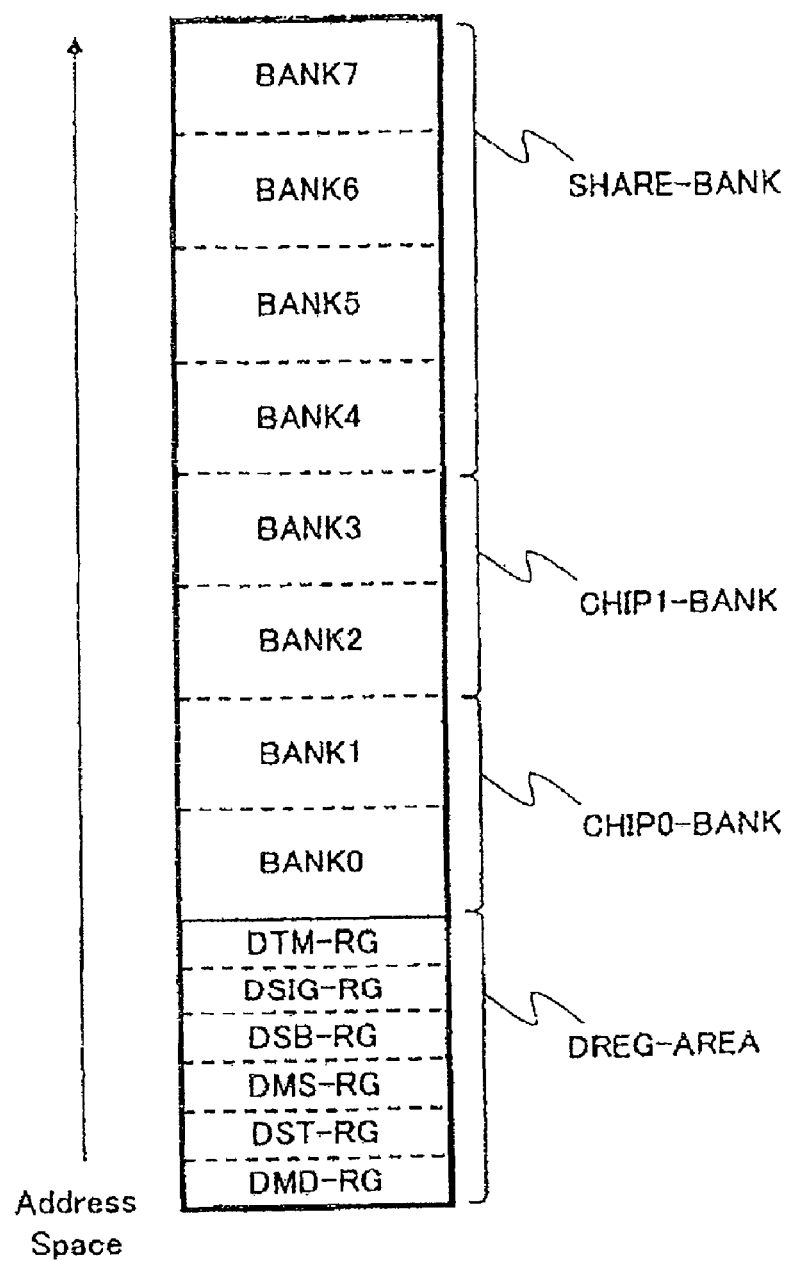
FIG. 15 is an explanatory view showing an example of the memory map of the multiport memory in the information processing system that is the second embodiment of the application of the present invention.

FIG. 15 shows an example of a memory map of multiport memory MPMEM2 that is set by shared bank register DSB-RG and memory management circuit DMMU.

Although no particular limitations are imposed, multiport memory MPMEM2 is a dynamic random access memory that employs dynamic random access memory cells and has a read time in the order of 15 ns.

Although no particular limitation is imposed, multiport memory MPMEM2 is divided into register area DREG-AREA, occupied memory banks CHIP0-BANK of information processing device CHIP0, occupied memory banks CHIP1-BANK of information processing device CHIP1, and shared memory banks SHARE-BANK of information processing device CHIP0 and information processing device CHIP1.

Register area DREG-AREA is divided into mode register DMD-RG, status register DST-RG, master register DMS-RG, shared bank register DSB-RG, status notification signal register DSIG-RG, and timing register DTM-RG.

Occupied memory banks CHIP0-BANK are assigned to memory banks BANK0 to BANK1, occupied memory banks CHIP1-BANK are assigned to memory banks BANK2 to BANK3, and shared memory banks SHARE-BANK are assigned to memory banks BANK4 to BANK7.

As described hereinabove, memory banks BANK0-BANK7 in memory array DMA0 can be flexibly set to occupied memory banks and shared memory banks to match the system by shared bank register DSB-RG and memory management circuit DMMU.

Initial Sequence When Powering Up

Figure 16:
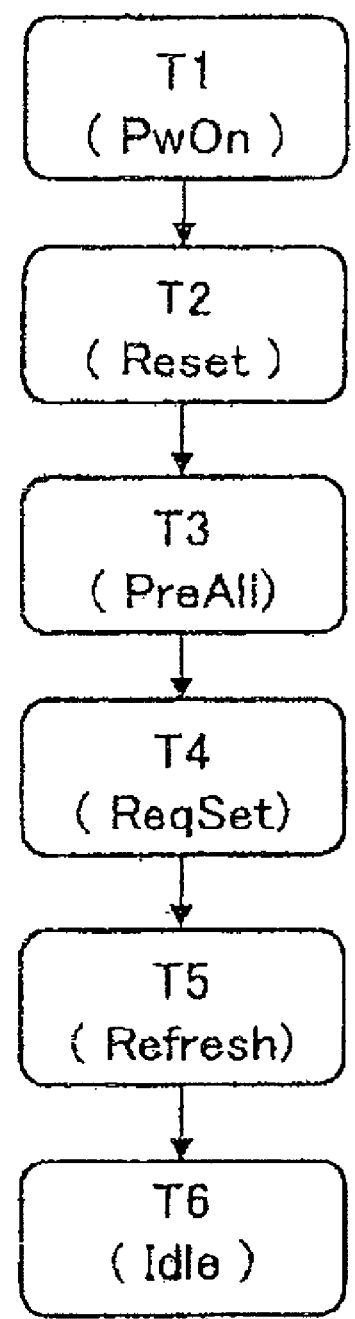
FIG. 16 shows an example of the operations when powering up the information processing system that is the second embodiment of the application of the present invention.

FIG. 16 shows an example of the initial sequence when powering up the information processing system that is made up of information processing device CHIP0, information processing device CHIP1 and multiport memory MPMEM 2.

Power is introduced to multiport memory MPMEM2 at the time interval of T1 (PwON), and resetting is carried out at the time interval of T2 (Reset). Although no particular limitations apply to the method of resetting, a method may be implemented in which resetting is implemented automatically in each incorporated circuit, or an external reset terminal may be provided and a resetting operation then carried out by means of a reset signal.

At this time interval of T2 (Reset), initial setting circuit DINIT initializes mode register DMD-RG, memory management circuit DMMU, timing register DTM-RG, status notification signal register DSIG-RG, shared bank register DSB-RG, master register DMS-RG, and status register DST-RG.

By means of this initialization, the initial address space of multiport memory MPMEM2 is set in memory management circuit DMMU, and the initial values are set in timing register DTM-RG, status notification signal register DSIG-RG, shared bank register DSB-RG, master register DMS-RG, and status register DST-RG.

Although no particular limitation is imposed, at the time interval of T3 (PreAll) in which the resetting of the time interval of T2 is released, precharge-all command PRE_ALL0 is applied as input from information processing device CHIP0 and precharging is carried out for all banks of memory banks BANK0-BANK7.

At the time interval (RegSet) of T4 following the completion of the time interval of T3, data writing is carried out to each register and the value in each register is set to a desired value.

Although no particular limitation is imposed, at the time interval (Refresh) of T5 after completion of the time interval of T4, auto-refresh commands REF0 are applied a plurality of times from information processing device CHIP0 and refresh is carried out a plurality of time for all memory banks BANK0-BANK7.

After the time interval (Idle) of T6 after completion of the time interval of T5, multiport memory MPMEM2 enters an idle state and is in a standby state for requests from information processing device CHIP0 and information processing device CHIP1.

Explanation of Status Information Output

An example of operations relating to the output of status notification signal SIG1 of multiport memory MPMEM2 and the status information output from input/output signal I/O1 when a request is issued to multiport memory MPMEM2 from information processing device CHIP0 may be carried out similarly to the operation of FIG. 4(a).

An example of operations relating to the output of signal SIG0 of multiport memory MPMEM2 and the status information output from input/output signal I/O0 when a request is issued to multiport memory MPMEM 2 from information processing device CHIP1 may be carried out similarly to the operations of FIG. 4(b).

Explanation of Access Arbitration

Figure 17:
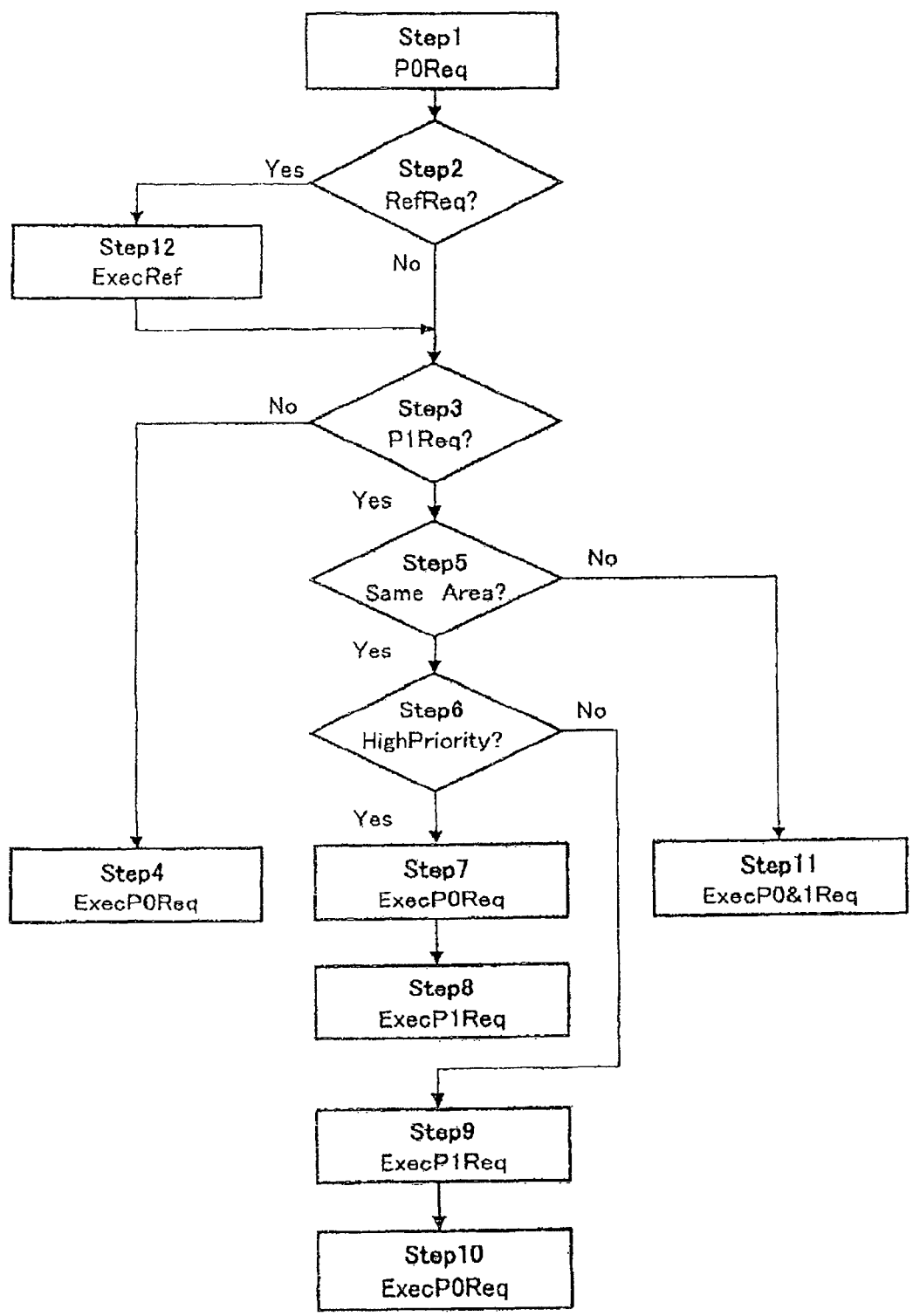
FIG. 17 is a flow chart showing an example of the operations for issuing a request to a multiport memory in the information processing system that is the second embodiment of the application of the present invention.

FIG. 17 is a flow chart showing an example of the request arbitration operation carried out by arbitration circuit ARBITOR of multiport memory MPMEM2 when requests to multiport memory MPMEM2 occur from information processing device CHIP0 and information processing device CHIP1.

When request P0Req is applied as input to multiport memory MPMEM2 from information processing device CHIP0 (Step 1), arbitration circuit ARBITOR checks whether a refresh request operation is being carried out in multiport memory MPMEM2 (Step 2). If a refresh operation is being carried out, arbitration circuit ARBITOR waits for the completion of this refresh operation (Step 12) and then checks whether there is a request P1Req from information processing device CHIP1 (Step 3).

If a refresh operation is not being carried out, arbitration circuit ARBITOR immediately checks whether there is a request P1Req from information processing device CHIP1 (Step 3). If there is no request P1Req, request P0Req is executed (Step 4). If there is a request P1Req, arbitration circuit ARBITOR checks whether request P0Req and request P1Req are made to the same memory area (Step 5). If the requests are not made to the same memory area, request P0Req and request P1Req are executed simultaneously (Step 11). If the requests are made to the same memory area, arbitration circuit ARBITOR checks the order of priority of request P0Req and request P1Req (Step 6). If the order of priority of request P0Req is higher, request P0Req is executed (Step 7), following which request P1Req is executed (Step 8). If the order of priority of request P1Req is higher, request P1Req is executed (Step 9), following which request P0Req is executed (Step 10).

Explanation of Registers

Explanation of Mode Register DMD-RG

FIG. 18 shows an example of the setting values of mode register DMD-RG in multiport memory MPMEM2.

Mode register DMD-RG is made up of DMD-RG [7:0], although no particular limitation applies.

In DMD-RG [1:0], the burst length is set when there is a data-read from multiport memory MPMEM2 or when there is a data-write to multiport memory MPMEM2. Although no particularly limitation is implied, the burst length is set to "2" when the value of DMD-RG [1:0] is "0" in a decimal number, is set to "4" when the value of DMD-RG [1:0] is "1," is set to "8" when the value of DMD-RG [1:0] is "2," and is set to "16" when the value of DMD-RG [1:0] is "3."

In DMD-RG [4:2], the latency is set when there is a data-read from multiport memory MPMEM2. Although no particular limitations are implied, latency is set to "1" when the value of DMD-RG [4:2] is the decimal number "0," is set to "2" when the value of DMD-RG [4:2] is "1," is set to "3" when the value of DMD-RG [4:2] is "2," is set to "4" when the value of DMD-RG [4:2] is "3," is set to "5" when the value of DMD-RG [4:2] is "4," is set to "6" when the value of DMD-RG [4:2] is "5," is set to "7" when the value of DMD-RG [4:2] is "6," and is set to "8" when the value of DMD-RG [4:2] is "7."

In DMD-RG [7:5], the latency is set when there is a data-write to multiport memory MPMEM2. Although no particular limitations are implied, latency is set to "1" when the value of DMD-RG [7:5] is the decimal number "0," is set to "2" when the value of DMD-RG [7:5] is "1," is set to "3" when the value of DMD-RG [7:5] is "2," is set to "4" when the value of DMD-RG [7:5] is "3," is set to "5" when the value of DMD-RG [7:5] is "4," is set to "6" when the value of DMD-RG [7:5] is "5," is set to "7" when the value of DMD-RG [7:5] is "6," and is set to "8" when the value of DMD-RG [7:5] is "7."

Explanation of Timing Register DTM-RG

FIG. 19 shows an example of the setting values of timing register DTM-RG in multiport memory MPMEM2.

Although no particular limitations apply, timing register DTM-RG is made up of DTM-RG0 [15:0], DTM-RG1 [15:0], and DTM-RG2 [15:0].

DTM-RG0 [7:0] shows the minimum number of clock cycles until a read command or a write command is input after bank-active command BA, and although no particular limitation is implied, is here set to 6 cycles.

DTM-RG0 [15:8] shows the minimum number of clock cycles until bank-active command BA is input after a pre-charge command PRE or a precharge-all command PREALL, and although no particular limitation is imposed, is set to 6 cycles.

DTM-RG1 [7:0] shows the minimum number of clock cycles of data reading after read command READ. Although no particular limitation is imposed, this number of cycles is 4+(burst length/2) if the latency value LAT set in mode register DTM-RG is no greater than "4" and is LAT+(burst length/2) if the latency value LAT is greater than "4."

DTM-RG1 [15:8] indicates the minimum number of clock cycles of data writing after write command WRITE. Although no particular limitation is imposed, this number of cycles is 4+(burst length/2) if latency value LAT set in mode register DTM-RG is no greater than "4" and is LAT+(burst length/2) if latency value LAT is greater than "4."

DTM-RG1 [7:0] indicates the minimum refresh time interval following auto-refresh command AUTOREF, and although no particular limitation is imposed, is here set to 12 cycles. By means of auto-refresh command AUTOREF, all memory banks in multiport memory MPMEM2 can be refreshed.

DTM-RG1 [15:8] indicates the minimum refresh time interval following bank-refresh command BANKREF, and although no particular limitation is imposed, is here set to 10 cycles. By means of bank-refresh command BANKREF and a bank address, a desired memory bank in multiport memory MPMEM2 can be refreshed.

Explanation of Status Notification Signal Register DSIG-RG

FIG. 20 shows an example of setting values of status notification signal register DSIG-RG in multiport memory MPMEM2.

Although no particular limitation is imposed, status notification signal register DSIG-RG is made up of the 16 bits DSIG-RG [15:0].

DSIG-RG [0] is a bit relating to bank-active command BA to a shared memory bank and is set to "1."

Setting DSIG-RG [0] to "1" indicates that status notification signal SIG1 becomes "High" when bank-active command BA is issued to a shared memory bank from information processing device CHIP0 and that status signal SIG0 becomes "High" when bank-active command BA is issued to a shared memory bank from information processing device CHIP1.

DSIG-RG [1] is a bit relating to data read command READ to a shared memory bank and is set to "1."

Setting DSIG-RG [1] to "1" indicates that status notification signal SIG1 becomes "High" when data read command READ is issued to a shared memory bank from information processing device CHIP0 and that status notification signal SIG0 becomes "High" when data read command READ is issued to a shared memory bank from information processing device CHIP1.

DSIG-RG [2] is a bit relating to data write command WRITE to a shared memory bank and is set to "1."

Setting DSIG-RG [2] to "1" indicates that status notification signal SIG1 becomes "High" when data write command WRITE is issued to a shared memory bank from information processing device CHIP0 and that status notification signal SIG0 becomes "High" when data write command WRITE is issued to a shared memory bank from information processing device CHIP1.

DSIG-RG [3] is a bit relating to precharge command PRE to a shared memory bank and is set to "1."

Setting DSIG-RG [3] to "1" indicates that status notification signal SIG1 becomes "High" when precharge command PRE is issued to a shared memory bank from information processing device CHIP0 and that status notification signal SIG0 becomes "High" when precharge command PRE is issued to a shared memory bank from information processing device CHIP1.

DSIG-RG [4] is a bit relating to precharge-all command PREALL to a shared memory bank and is set to "1."

Setting DSIG-RG [4] to "1" indicates that status notification signal SIG1 becomes "High" when precharge-all command PREALL is issued to a shared memory bank from information processing device CHIP0 and that status notification signal SIG0 becomes "High" when precharge-all command PREALL is issued to a shared memory bank from information processing device CHIP1.

DSIG-RG [5] is a bit relating to bank-refresh command BANKREF to a shared memory bank and is set to "1."

Setting DSIG-RG [5] to "1" indicates that status notification signal SIG1 becomes "High" when bank-refresh command BANKREF is issued to a shared memory bank from information processing device CHIP0 and that status notification signal SIG0 becomes "High" when bank-refresh command BANKREF is issued to a shared memory bank from information processing device CHIP1.

DSIG-RG [6] is a bit relating to auto-refresh command AUTOREF to a shared memory bank and is set to "1."

Setting DSIG-RG [6] to "1" indicates that status notification signal SIG1 becomes "High" when auto-refresh command AUTOREF is issued to a shared memory bank from information processing device CHIP0 and that status notification signal SIG0 becomes "High" when auto-refresh command AUTOREF is issued to a shared memory bank from information processing device CHIP1.

Explanation of shared bank register DSB-RG

FIG. 21 shows an example of setting values of shared bank register DSB-RG in multiport memory MPMEM2.

Although no particular limitations are imposed, shared bank register DSB-RG is made up of the 32 bits DSB-RG [31:0].

DSB-RG [7:01] are bits for setting a shared memory bank, DSB-RG [15:8] are bits for setting an occupied memory bank of information processing device CHIP0, and DSB-RG [23:16] are bits for setting an occupied memory bank of information processing device CHIP1.

Each bit of DSB-RG [7:0] corresponds to a memory bank of memory banks BANK7 to 0, and for example, when the value of DSB-RG [7] is set to "1," memory bank 7 (BANK7) becomes a shared memory bank.

Although no particular limitation is implied, the value of DSB-RG [7:4] is set to "1," whereby memory banks from memory bank 7 (BANK7) to memory bank 4 (BANK4) are shared memory banks of information processing device CHIP0 and information processing device CHIP1.

Each bit of DSB-RG [15:8] corresponds to a memory bank from memory banks BANK7 to 0, and when, for example, the value of DSB-RG [8] is "1," memory bank 0 (BANK0) becomes an occupied memory bank of information processing device CHIP0.

Although no particular limitations are imposed, the value of DSB-RG [9:8] is set to "1," whereby memory banks from memory bank 0 (BANK0) to memory bank 1 (BANK1) become the occupied memory banks of information processing device CHIP0.

Each bit of DSB-RG [23:16] corresponds to a memory bank from memory banks BANK7 to 0, and for example, when the value of DSB-RG [18] is set to "1," memory bank 2 (BANK2) becomes an occupied memory bank of information processing device CHIP1.

Although no particular limitations are imposed, the value of DSB-RG [19:18] is here set to "1," whereby memory banks from memory bank 2 (BANK2) to memory bank 3 (BANK3) become occupied memory banks of information processing device CHIP1.

Explanation of Master Register DMS-RG

FIG. 22 shows an example of setting values of master register DMS-RG in multiport memory MPMEM2.

Master register DMS-RG is made up of 8 bits of DMS-RG [7:01], although no particular limitation is imposed.

Although no particular limitation is imposed, DMS-RG [3:0] is a bit area for setting which port's request is to be given priority processing when requests are simultaneously issued from each port to shared memory banks. In addition, although no particular limitation is imposed, DMS-RG [7:4] is a bit area for setting the port to receive a refresh command for refreshing the memory banks of multiport memory MPMEM2.

Each bit of DMS-RG [1:0] corresponds to a port of multiport memory MPMEM2. For example, DMS-RG [0] corresponds to port 0 (DPT0) and DMS-RG [1] corresponds to port 1 (DPT1).

As shown by the example of FIG. 22, when DMS-RG [1] and DMS-RG [0] are each set to "0," the order of priority of port 0 (DPT0) and port 1 (DPT1) changes according to a round-robin mode.

When DMS-RG [1] is set to "0" and DMS-RG [0] is set to "1," port 0 (DPT0) is the priority port.

When DMS-RG [1] is set to "1" and DMS-RG [0] is set to "0," port 1 (DPT1) is the priority port.

When each of DMS-RG [1] and DMS-RG [0] is set to "1," the order of priority of port 0 (DPT0) and port 1 (DPT1) changes according to a round robin mode.

Although there are other setting values for the setting values of master register DMS-RG [1:0], these values are omitted in FIG. 22.

Each bit of DMS-RG [5:4] corresponds to a port of multiport memory MPMEM2. For example, DMS-RG [4] corresponds to port 0 (DPT0) and DMS-RG [5] corresponds to port 1 (DPT1).

As shown in the example of FIG. 22, when DMS-RG [5] is set to "0" and DMS-RG [4] is set to "1," multiport memory MPMEM2 receives a refresh command from port 0 (DPT0) and carries out the refresh operation.

When DMS-RG [5] is set to "1" and DMS-RG [4] is set to "0," multiport memory MPMEM2 receives a refresh command from port 1 (DPT1) and carries out the refresh operation.

Although there are other setting values for master register DMS-RG [5:4], these values are omitted from FIG. 22.

Explanation of Status Register DST-RG

FIG. 23 shows an example of the setting values of status register DST-RG in multiport memory MPMEM2.

Although no particular limitation is imposed, status register DST-RG is made up of the 32 bits of DST-RG [31:0], DST-RG [15:0] stores status information (such as commands, execution memory bank, and completion times) relating to requests from port 0 (DPT0), and DST-RG [31:16] stores status information (such as commands, execution memory banks, and completion times) relating to requests from port 1 (DPT1).

DST-RG [3:0] holds the command that is currently being executed from port 0 (DPT0). When "0," DST-RG [3:0] indicates that no command is currently being executed (P0_Nop), indicates that a read command (P0_Read) is being executed when "1," indicates that a write command (P0_Write) is being executed when "2," indicates that a bank-active command (P0_BA) is being executed when "3," indicates that a precharge command (P0_Pre) is being executed when "4," indicates that a precharge-all command (P0_PreAll) is being executed when "5," indicates that a bank-refresh command (P0_BkRef) is being executed when "6," and indicates that an auto-refresh command (P0_Ref) is being executed when "7."

Although no particular limitations are imposed, DST-RG [3:0] can hold 16 types of commands, and the commands that are held can be added as needed.

DST-RG [7:4] holds the memory bank value that is currently being accessed from port 0 (DPT0). When "7," DST-RG [7:4] indicates the current occurrence of access to memory bank BANK7.

DST-RG [15:8] holds the completion time of the operation for the command that is currently being executed from port 0 (DPT0). When "5," DST-RG [15:8] indicates that the operation for the command will end after 5 clock cycles.

DST-RG [19:16] holds the command that is currently being executed from port 1 (DPT1). When "0," DST-RG [19:16] indicates that no command is currently being executed (P1_Nop), indicates that a read command (P1_Read) is being executed when "1," indicates that a write command (P1_Write) is being executed when "2," indicates that a bank-active command (P1_BA) is being executed when "3," indicates that a precharge command (P1_Pre) is being executed when "4," indicates that a precharge-all command (P1_PreAll) is being executed when "5," indicates that a bank-refresh command (P1_BkRef) is being executed when "6," and indicates that an auto-refresh command (P1_Ref) is being executed when "7."

Although no particular limitations apply, DST-RG [19:16] can hold 16 types of commands and commands that are held can be added as needed.

DST-RG [23:20] holds a memory bank value that is currently being accessed from port 1 (DPT1). When "6," DST-RG [23:20] indicates the current occurrence of access to memory bank BANK6.

DST-RG [31:24] holds the completion time of the operation for the command that is currently being executed from port 1 (DPT1). When "5," DST-RG [31:24] indicates that the operation for the command will be completed after 5 clock cycles.

In addition, the size of status register DST-RG can obviously be expanded by the number of ports.

Explanation of Status Information Output from I/O

FIG. 24 shows an example of status information (for example, command, memory bank, and completion time) supplied from input/output signals I/O0 and I/O1 of multiport memory MPMEM2.

Input/output signal I/O0 supplies status information (for example, command, memory bank value, and completion time) for a request from port 1 (DPT1).

Although no particular limitations are imposed, input/output signal I/O0 is made up of 16 bits of I/O0 [15:0], with I/O0 [3:0] indicating the command that is being executed, I/O0 [7:4] indicating the memory bank that is being accessed, and I/O0 [15:8] indicating the completion time of the command that is being executed.

When "0," I/O0 [3:0] indicates that no command is currently being executed (P1_Nop) from port 1 (DPT1), indicates that a read command (P1_Read) is currently being executed when "1," indicates that a write command (P1_Write) is being executed when "2," indicates that a bank-active command (P1_BA) is being executed when "3," indicates that a precharge command (P1_Pre) is being executed when "4," indicates that a precharge-all command (P1_PreAll) is being executed when "5," indicates that a bank-refresh command (P1_BkRef) is being executed when "6," and indicates that an auto-refresh command (P1_Ref) is being executed when "7."

When "7," I/O0 [7:4] indicates the current occurrence of access to memory bank BANK7 from port 1 (DPT1).

When "5," I/O0 [15:8] indicates the command currently being executed from port 1 (DPT1) will be completed after 5 cycles.

Input/output signal I/O1 supplies status information (such as the command, memory bank value, and completion time) for requests from port 0 (DPT0).

Although no particular limitations are imposed, input/output signal I/O1 is composed of 16 bits of I/O1 [15:0], with I/O1 [3:0] indicating the command that is currently being executed, I/O1 [7:4] indicating the memory bank that is being accessed, and I/O1 [15:8] indicating the completion time of the command that is being executed.

When "0," I/O1 [3:0] indicates that no command is currently being executed (P0_Nop) from port 0 (DPT0), indicates that a read command (P0_Read) is currently being executed when "1," indicates that a write command (P0_Write) is being executed when "2," indicates that a bank-active command (P0_BA) is being executed when "3," indicates that a precharge command (P0_Pre) is being executed when "4," indicates that a precharge-all command (P0_PreAll) is being executed when "5," indicates that a bank-refresh command (P0_BkRef) is being executed when "6," and indicates that an auto-refresh command (P0_Ref) is being executed when "7."

When "6," I/O1 [7:4] indicates the current occurrence of access to memory bank BANK6 from port 0 (DPT0).

When "5," I/O1 [15:8] indicates that the command currently being executed from port 0 (DPT0) will be completed after 5 cycles.

Explanation of Operating Waveforms

Figure 25:
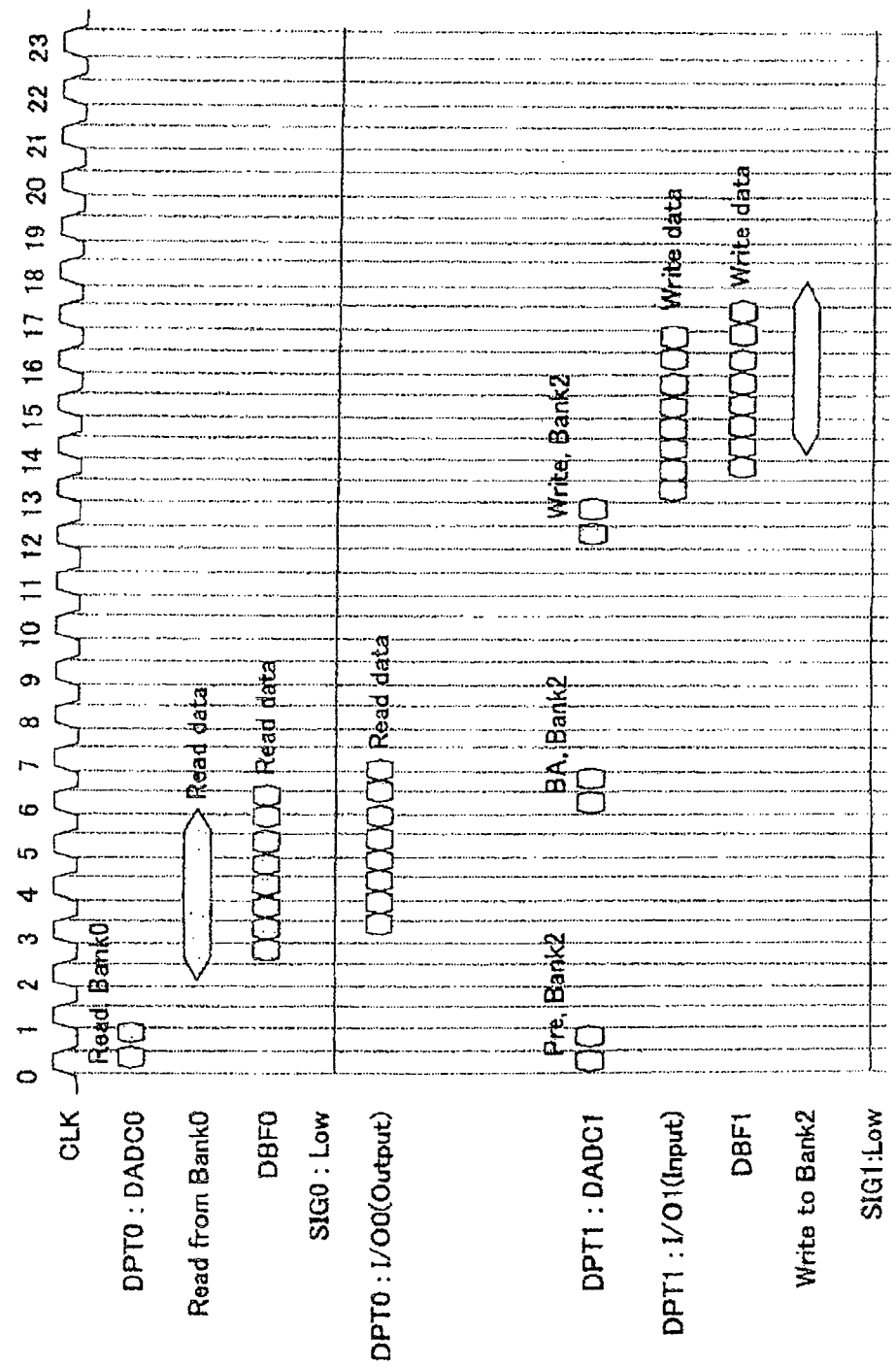
FIG. 25 shows an example of operating waveforms (reading and writing to each occupied area) in the information processing system that is the second embodiment of the application of the present invention.

FIG. 25 shows an example of the operating waveforms of multiport memory MPMEM2 when a read request from information processing circuit CPU00 in information processing device CHIP0 is determined in memory control circuit MCON0 to be a page hit to memory bank BANK0, which is an occupied area of information processing device CHIP0, and a write request from information processing circuit CPU10 in information processing device CHIP1 is determined in memory control circuit MCON1 to be a page miss to memory bank BANK2 that is an occupied area of information processing device CHIP1.

Read command READ and address value ADD0 are applied as input via signal DADC0 to multiport memory MPMEM2 from information processing device CHIP0 in synchronization with clock CLK.

By means of read command READ and address value ADD0 that are applied as input, data that are held in memory bank BANK0, which is an occupied area of information processing device CHIP0, are read (Read from Bank0).

The data that are read from memory bank BANK0 are transmitted to buffer DBF0 and supplied from input/output signal I/O0. When a request is applied as input to an occupied area of information processing device CHIP0 from information processing device CHIP0, status information notification signal SIG1 remains unchanged at "Low" without becoming "High."

Precharge command PRE and bank address Bank 2 are applied as input through signal DADC1 to multiport memory MPMEM2 from information processing device CHIP1 in synchronization with clock CLK, bank-active command BA, bank address value Bank2, and row address Row2 are next applied as input, and finally, write command WRITE and bank address Bank2 and column address Col0 are applied as input and write data WDATA2 are applied as input from input/output signal I/O1.

By means of write command WRITE, bank address Bank 2, and column address Col0 that are received as input, write data WDATA2 are written to memory bank BANK2 by way of buffer DBF1.

When a request to an occupied area of information processing device CHIP1 is received as input from information processing device CHIP1, status information notification signal SIG0 remains unchanged at "Low" and does not become "High."

Thus, because no access competition arises for requests to memory banks occupied by each of information processing devices CHIP0 and CHIP1, the requests can be executed without either information processing device interfering with the request to the other information processing device. As a result, requests from each information processing device can be executed simultaneously and high-speed processing is enabled.

Although operations relating to a read request from port 0 (DPT0) and a write request from port 1 (DPT1) are explained in FIG. 25, operations relating to other requests to port (DPT0) and other requests to port 1 (DPT1) are obviously carried out similarly.

Figure 26:
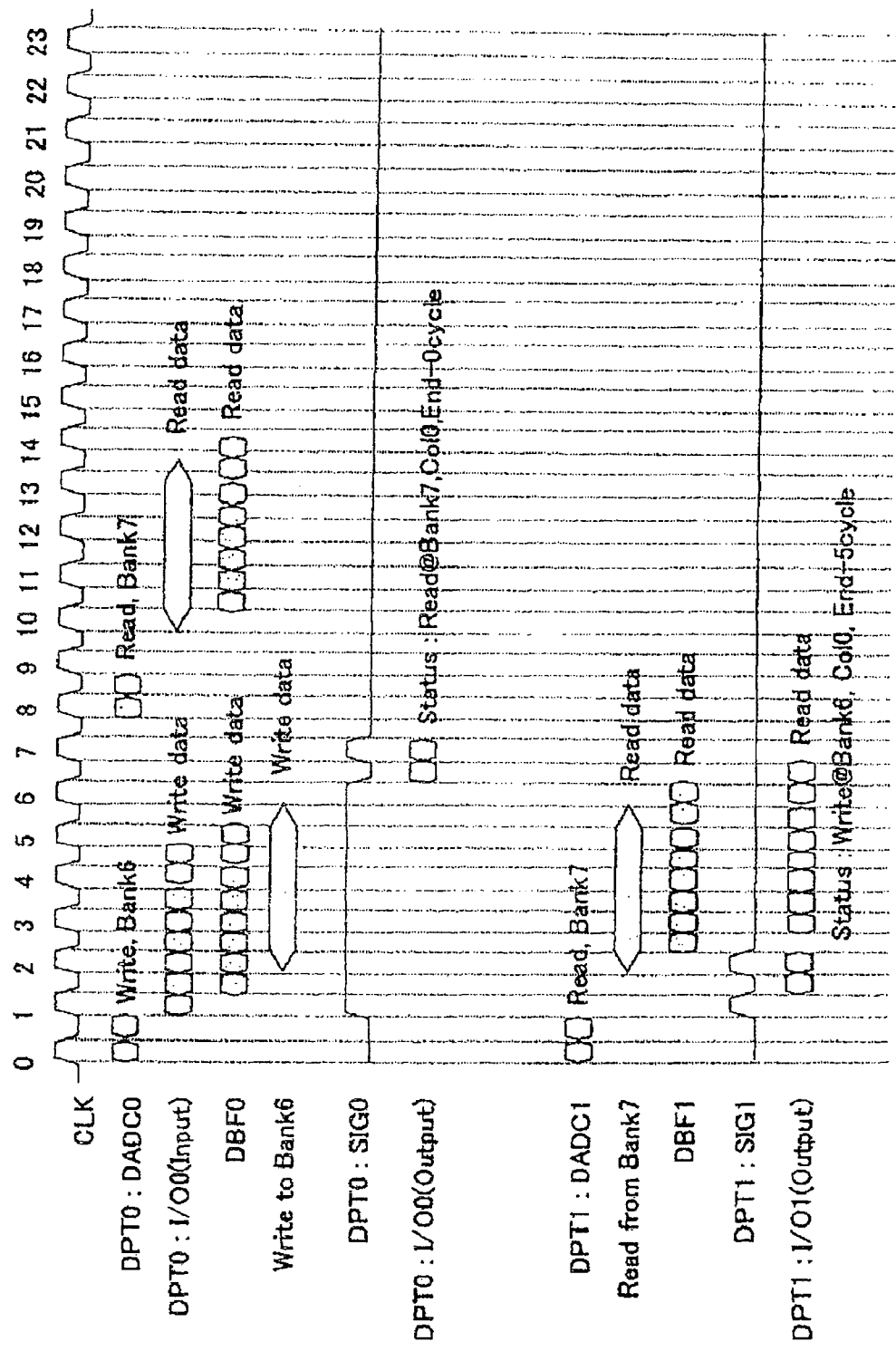
FIG. 26 shows an example of operating waveforms (writing and reading to different shared areas) in the information processing system that is the second embodiment of the application of the present invention.

FIG. 26 shows an example of the operating waveforms of multiport memory MPMEM2 when a write request from information processing circuit CPU00 in information processing device CHIP0 is determined in memory control circuit MCON0 to be a page hit to memory bank BANK6 that is a shared area and a read request from information processing circuit CPU10 in information processing device CHIP1 is determined in memory control circuit MCON1 to be a page hit of to memory bank BANK7 that is a shared area of information processing device CHIP1.

Write command WRITE, bank address Bank6, and column address Col0 are applied from information processing device CHIP0 via signal DADC0 as input to multiport memory MPMEM2 in synchronization with clock CLK.

By means of write command WRITE, bank address Bank6, and column address Col0 that are applied as input, write data WDATA6 are written to memory bank BANK6 by way of buffer DBF0.

When a request to a shared area is applied as input from information processing device CHIP0, signal SIG1 becomes "High," and notification is sent to information processing device CHIP1 that a request from information processing device CHIP0 is being executed. Status signal relating to the request (write command WRITE, memory bank BANK6, column address 0, and a completion time of 5 cycles indicating that the operation will be completed after five cycles) is next supplied from input/output signal I/O1, By means of this status signal, information processing device CHIP1 is able to know the actual content of the request from information processing device CHIP0. After output of the status signal from input/output signal I/O1, signal SIG1 becomes "Low."

Information processing device CHIP1 saves this status signal from input/output signal I/O1 to its own memory control circuit MCON1, and is thus able to acquire the actual content of the request that information processing device CHIP0 is executing in multiport memory MPMEM2.

Because the actual content of the request of information processing device CHIP0 is saved in information processing device CHIP1, information processing device CHIP1 is able to determine the type of request that should be supplied.

Read command READ, bank address Bank7, and column address Col0 are applied via signal DADC1 from information processing device CHIP1 as input to multiport memory MPMEM2 in synchronization with clock CLK.

By means of read command READ, bank address Bank7, and column address Col0 that are received as input, the data that are saved in memory bank BANK7 are read (Read from Bank7).

The data that were read from memory bank BANK7 are transmitted to buffer DBF1 and supplied from input/output signal I/O1.

When a request to a shared area is applied as input from information processing device CHIP1, signal SIG0 becomes "High," and notification is sent to information processing device CHIP0 that a request from information processing device CHIP1 is being executed. A status signal relating to the request (read command READ, memory bank BANK7, column address 0, and completion time of 0 cycles indicating that the operation is already completed) is next supplied from input/output signal I/O0. By means of this status signal, information processing device CHIP0 can know the actual content of the request from information processing device CHIP1. After output of the status signal from input/output signal I/O0, signal SIG0 becomes "Low."

Information processing device CHIP0 saves this status signal from input/output signal I/O0 in its own memory control circuit MCON0 and is thus able to acquire the actual content of the request that information processing device CHIP1 is executing in multiport memory MPMEM2.

Because the actual content of the request of information processing device CHIP1 is saved in information processing device CHIP 0, information processing device CHIP0 is able to determine the request that should be supplied.

In this way, even when there are requests to shared memory areas of information processing devices CHIP0 and CHIP1, access competition does not occur as long as the memory banks differ, and each information processing device can execute the request without interfering with the request of the other information processing device. As a result, requests from each of the information processing devices can be executed simultaneously and high-speed processing is possible.

When a request is issued from information processing device CHIP0 to a shared memory area, signal SIG1 becomes "High," and by means of the status signal from input/output signal I/O1, information processing device CHIP1 can know the actual content of the request from information processing device CHIP0. As a result, information processing device CHIP1 can issue an optimum request to multiport memory MPMEM2 in the shortest time interval.

In addition, when a request is issued from information processing device CHIP1 to a shared memory area, signal SIG0 becomes "High," and by means of the status signal from input/output signal I/O0, information processing device CHIP0 is able to know the actual content of the request from information processing device CHIP1. As a result, information processing device CHIP0 is able to issue an optimum request to multiport memory MPMEM2 in the shortest time interval.

Although operations relating to a write request from port 0 (DPT0) and a read request from port 1 (DPT1) were described in FIG. 26, the operations are of course carried out similarly for other requests issued to port 0 (DPT0) and other requests issued to port 1 (DPT1).

Figure 27:
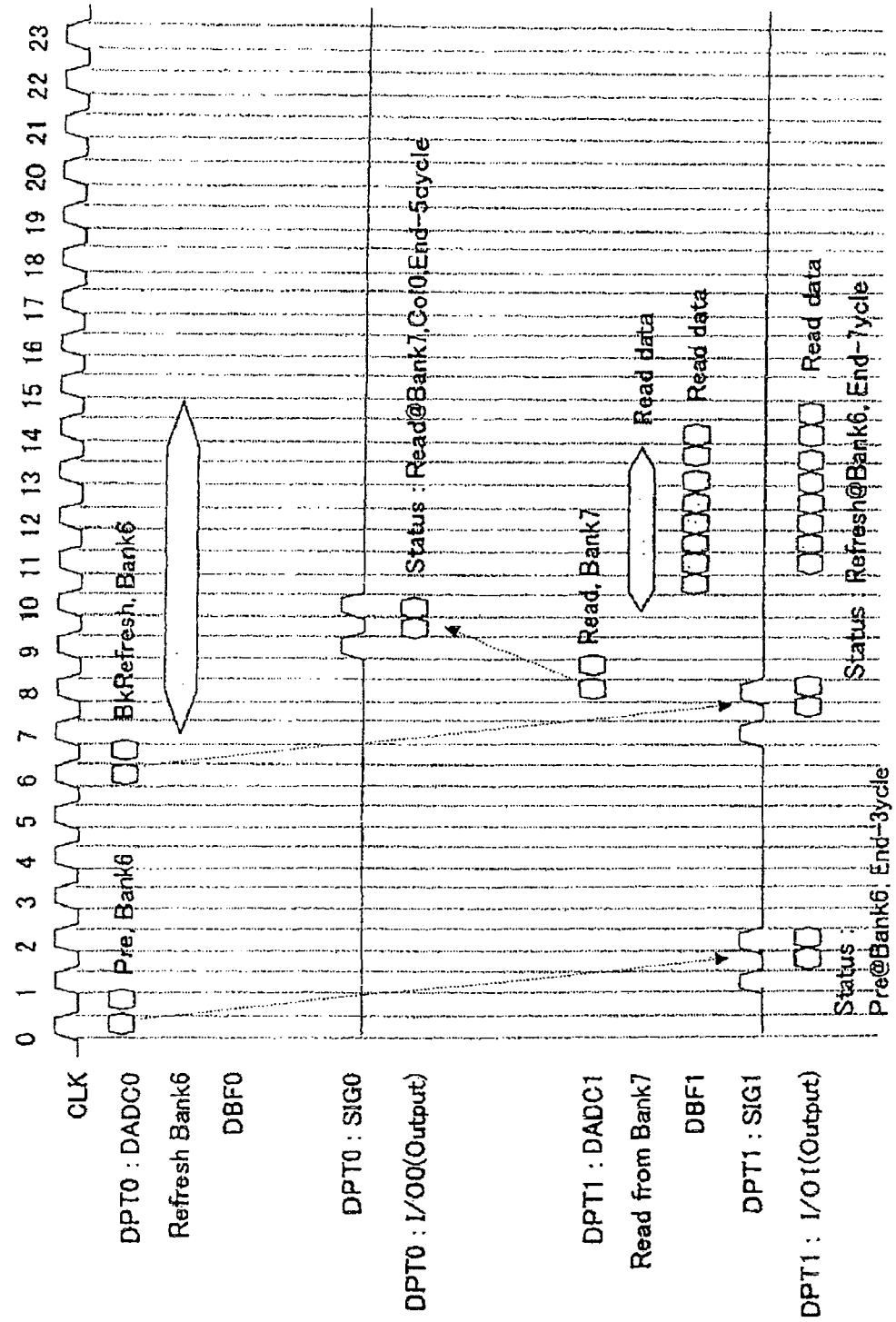
FIG. 27 shows an example of operating waveforms (refresh and reading with respect to different shared areas) in the information processing system that is the second embodiment of the application of the present invention.

FIG. 27 shows an example of the operating waveform of multiport memory MPMEM 2 when a refresh request is issued from information processing device CHIP0 to memory bank BANK6 that is a shared area in multiport memory MPMEM2, and a read request from information processing circuit CPU10 in information processing device CHIP1 is determined in memory control circuit MCON1 to be a page hit to memory bank BANK7 that is a shared area of information processing device CHIP1.

Explanation first regards the refresh request from information processing device CHIP0.

Precharge command Pre and bank address Bank6 are applied via signal DADC0 as input to multiport memory MPMEM2 from information processing device CHIP0 in synchronization with clock CLK, following which bank-refresh command BkRefresh and bank address Bank 6 are applied.

By means of precharge command Pre and bank address Bank6, the page of memory bank BANK6 is closed.

In addition, by means of this precharge command Pre, status notification signal SIG1 becomes "High" and notification is sent to information processing device CHIP1 that precharge command Pre from information processing device CHIP0 is being executed. A status signal relating to the request (precharge command Pre, memory bank BANK6, completion time of 3 cycles indicating that the operation will be completed after three cycles) is next supplied from input/output signal I/O1. By means of this status signal, information processing device CHIP1 is able to know the actual contents of the request from information processing device CHIP0. After output of the status signal from input/output signal I/O1, status notification signal SIG1 becomes "Low."

Information processing device CHIP1 saves the status signal from this input/output signal I/O1 in its own memory control circuit MCON1 and can thus acquire the actual content of the request that information processing device CHIP0 is executing in multiport memory MPMEM2.

By means of bank-refresh command BkRefresh and bank address Bank6, the refresh operation is carried out in memory bank BANK6.

By means of this bank-refresh command BkRef, status notification signal SIG1 becomes "High," and notification that refresh command BkRef from information processing device CHIP0 is being executed is sent to information processing device CHIP1. A status signal relating to the request (refresh command BkRef, memory bank BANK6, completion time of 7 cycles indicating that the operation will be completed after 7 cycles) is supplied from input/output signal I/O1. By means of this status signal, information processing device CHIP1 is able to know the actual content of the request from information processing device CHIP0. After the output of the status signal from input/output signal I/O1, status notification signal SIG1 becomes "Low."

Information processing device CHIP1 saves the status signal from this input/output signal I/O1 in its own memory control circuit MCON1 and is thus able to acquire the actual content of the request that information processing device CHIP0 is executing in multiport memory MPMEM2.

Because the actual contents of the request of information processing device CHIP0 are saved in information processing device CHIP1, information processing device CHIP1 is able to determine the request that should be supplied.

Explanation next regards the read request from information processing device CHIP1.

Read command READ, bank address Bank7, and column address Col0 are applied via signal DADC1 as input from information processing device CHIP1 to multiport memory MPMEM2 in synchronization with clock CLK.

By means of read command READ, bank address Bank7, and column address Col0 that are received as input, the data saved in memory bank BANK7 are read (Read from Bank 7).

The data that have been read from memory bank BANK7 are transmitted to buffer DBF1 and supplied from input/output signal I/O1.

In addition, by means of this read command READ, status notification signal SIG0 becomes "High," and notification that read command READ from information processing device CHIP1 is being executed is sent to information processing device CHIP0. A status signal relating to the request (read command READ, memory bank BANK7, column address 0, and completion time of 5 cycles indicating that the operation will be completed after five cycles) is supplied from input/output signal I/O0. By means of this status signal, information processing device CHIP0 is able to know the actual content of the request from information processing device CHIP1. After output of the status signal from input/output signal I/O0, signal SIG0 becomes "Low."

Information processing device CHIP0 saves this status signal from input/output signal I/O0 in its own memory control circuit MCON0 and is thus able to acquire the actual content of the request that information processing device CHIP1 is executing in multiport memory MPMEM2.

In addition, because the actual content of the request of information processing device CHIP1 is saved in information processing device CHIP0, information processing device CHIP0 is able to determine the request that should be supplied.

Read command READ from information processing device CHIP1 is issued to a memory bank that differs from the memory bank in which the refresh operation is being carried out and can therefore be executed without interference and without causing access competition with the refresh operation.

Figure 28:
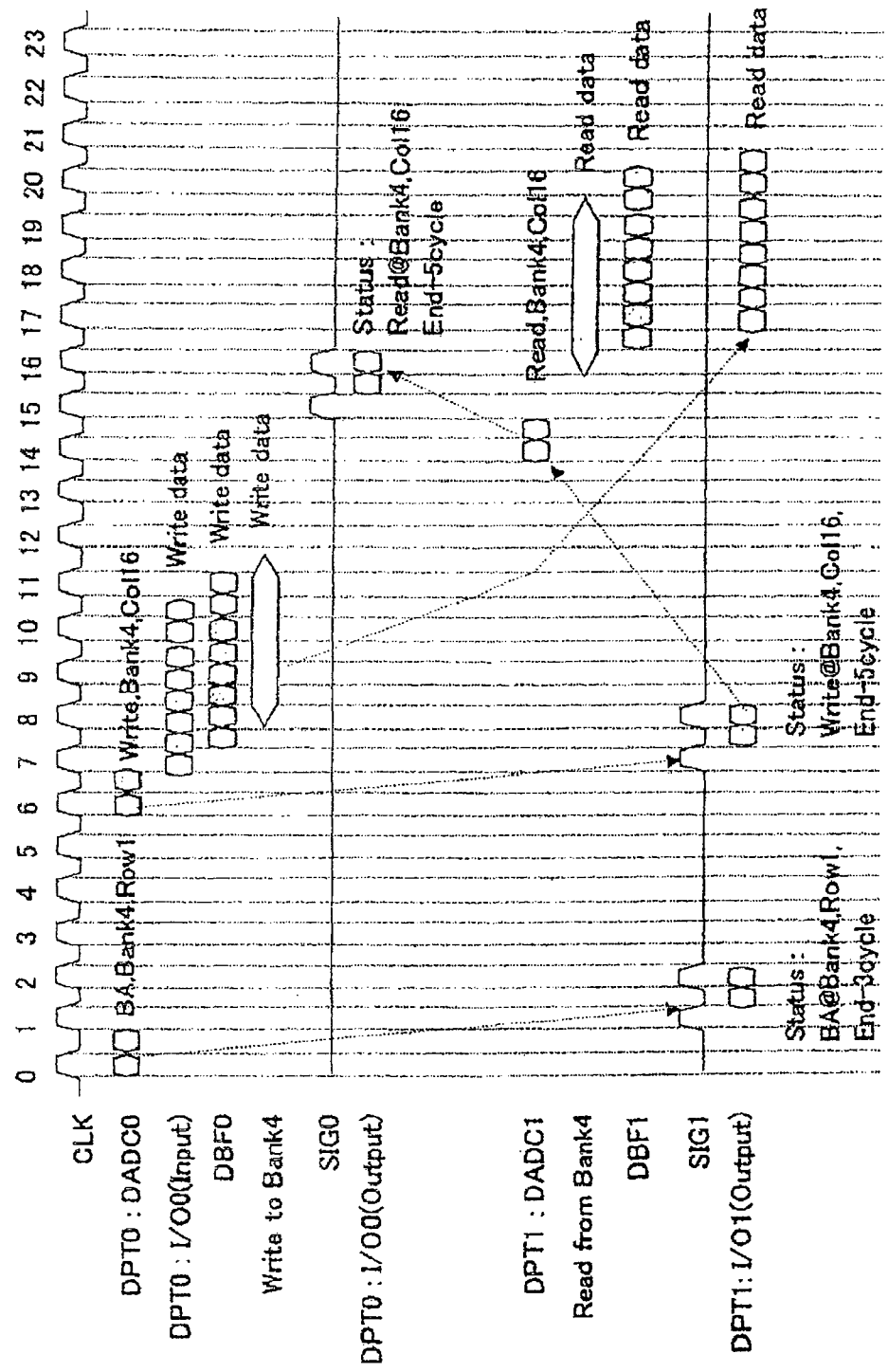
FIG. 28 shows an example of operating waveforms (writing and reading to the same shared area) in the information processing system that is the second embodiment of the application of the present invention.

FIG. 28 shows an example of the operating waveforms relating to data communication between information processing devices CHIP0 and CHIP1 when, in the state that follows the implementation of a refresh or precharge operation to memory bank BANK4 of multiport memory MPMEM2 and the closing of the page, information processing device CHIP0 writes data WDATA4 to memory bank BANK4 through port 0 (DPT0) and information processing device CHIP1 reads data WDATA4 that were written to memory bank BANK4 through port 1 (DPT1).

Explanation first regards the write request from information processing device CHIP0.

Bank-active command BA, bank address Bank4, and row address Row 1 are first applied as input via signal DADC0 to multiport memory MPMEM2 from information processing device CHIP0 in synchronization with clock CLK, following which write command WRITE, bank address Bank 2, and column address Col16 are applied as input. Write data WDATA4 are applied as input from input/output signal I/O1.

By means of the first bank-active command BA, bank address Bank 4, and row address Row 1, memory bank BANK4 is activated.

In addition, status notification signal SIG1 becomes "High," and notification that bank-active command BA from information processing device CHIP0 is being executed is sent to information processing device CHIP1.

A status signal (bank-active command BA, memory bank BANK4, row address Row1, and a completion time of 3 cycles indicating that the operation will be completed after three cycles) relating to this bank-active command BA is supplied from input/output signal I/O1. After supply of the status signal from input/output signal I/O1, signal SIG1 becomes "Low."

Information processing device CHIP1 saves this status signal from the input/output signal I/O1 in its own memory control circuit MCON1 and is thus able to acquire the actual content of the request that information processing device CHIP0 is executing in multiport memory MPMEM2.

By means of write command WRITE, bank address Bank4, and column address Col16, write data WDATA4 are written to memory bank BANK4 by way of buffer DBF1.

In addition, status notification signal SIG1 becomes "High," and notification that write command Write from information processing device CHIP0 is being executed is sent to information processing device CHIP1.

A status signal (write command Write, memory bank BANK4, column address 16, and a completion time of 5 cycles indicating that the operations will be completed after 5 cycles) relating to this write request is supplied from input/output signal I/O1. After the output of the status signal from input/output signal I/O1, signal SIG0 becomes "Low."

Information processing device CHIP1 saves the status signal from this input/output signal I/O1 in its own memory control circuit MCON1 and is thus able to acquire the actual content of the request that information processing device CHIP0 is executing in multiport memory MPMEM2. In other words, information processing device CHIP1 can know the completion time of write command Write from information processing device CHIP0.

By means of the status signal from input/output signal I/O1, information processing device CHIP1 is able to apply read command Read as input to multiport memory MPMEM2 immediately after completion of the write operation from information processing device CHIP0. More specifically, read command READ, bank address Bank4, and column address Col16 are applied via signal DADC1 to multiport memory MPMEM2, and data WDATA4 that were just written to memory bank BANK4 by information processing device CHIP0 are read (Read from Bank4).

The data that have been read from memory bank BANK4 are transmitted to buffer DBF1 and supplied from input/output signal I/O1.

Figure 29:
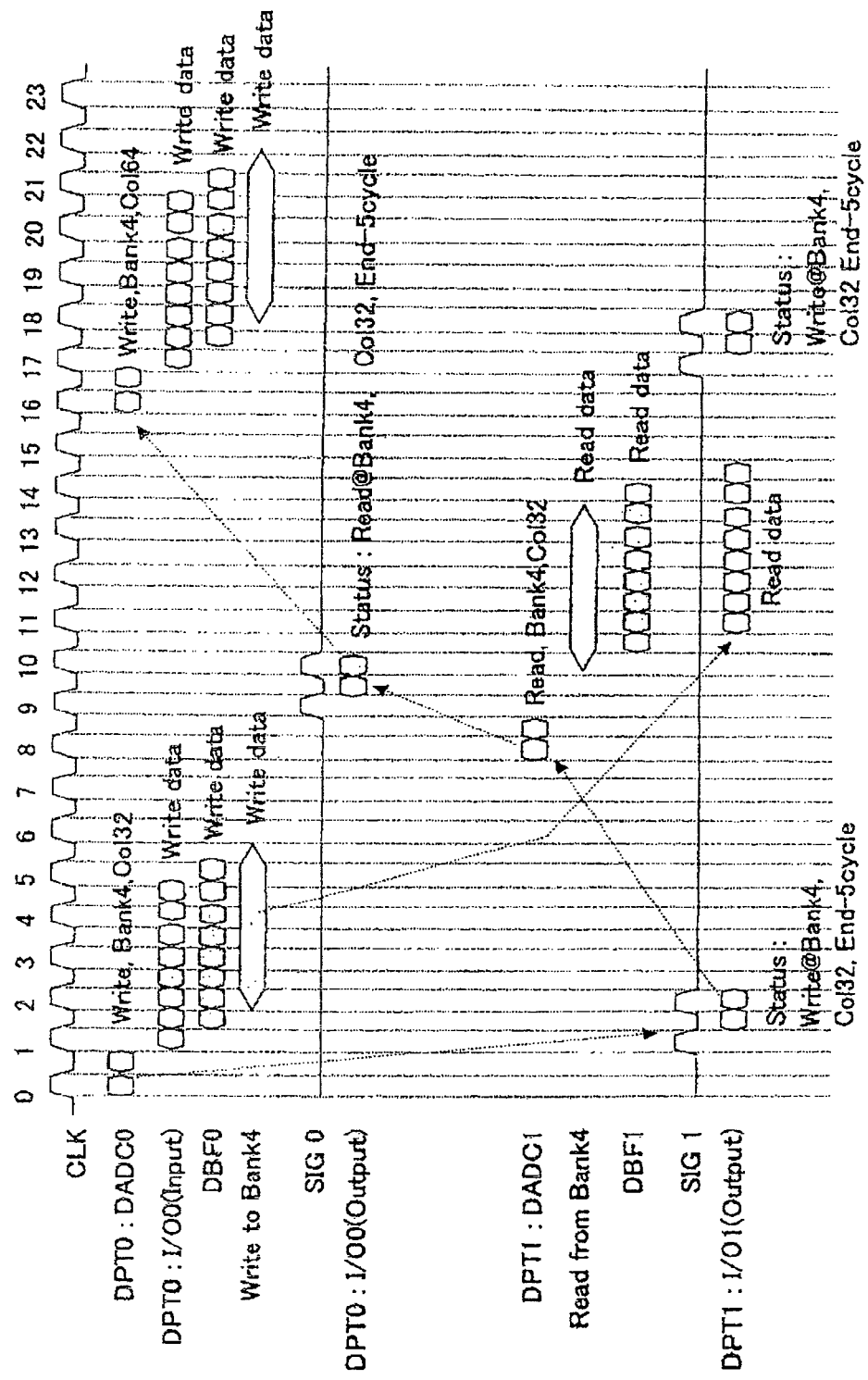
FIG. 29 shows an example of operating waveforms (writing and reading to the same shared area) in the information processing system that is the second embodiment of the application of the present invention.

FIG. 29 shows an example of the operating waveforms relating to data communication between information processing devices CHIP0 and CHIP1 when information processing device CHIP0 writes data WDATA4 through port 0 (DPT0) to memory bank BANK4, which is a shared area of multiport memory MPMEM2, and information processing device CHIP1, through port 1 (DPT1), reads data WDATA4 that have been written to memory bank BANK4.

Explanation will now be made regarding the write request from information processing device CHIP0.

Write command WRITE, bank address Bank4, and column address Col32 via signal DADC0, and further, write data WDATA4 from input/output signal I/O0, are first applied as input from information processing device CHIP0 to multiport memory MPMEM2 in synchronization with clock CLK.

By means of write command WRITE, bank address Bank4, and column address Col32 that have been received as input, memory bank BANK4, which is a shared area, is selected. Write data WDATA4 are written to memory bank BANK4 by way of buffer DBF0.

In addition, by means of this write command WRITE, status notification signal SIG1 becomes "High," and notification that write command WRITE from information processing device CHIP0 is being executed is sent to information processing device CHIP1. A status signal relating to this write request (write command WRITE, memory bank BANK4, column address 32, and a completion time of 5 cycles indicating that the operation will be completed after 5 cycles) is supplied from input/output signal I/O1. After output of the status signal from input/output signal I/O1, signal SIG0 becomes "Low."

Information processing device CHIP1 saves the status signal from this input/output signal I/O1 in its own memory control circuit MCON1 and is thus able to acquire the actual content of the request that information processing device CHIP0 is executing in multiport memory MPMEM2. In other words, information processing device CHIP1 is able to know the completion time of write command WRITE from information processing device CHIP0.

By means of the status signal from input/output signal I/O1, information processing device CHIP1 applies read command Read to multiport memory MPMEM2 immediately after the write operation from information processing device CHIP0 is completed. More specifically, read command READ, bank address Bank4, and column address Col32 are applied as input to multiport memory MPMEM2 via signal DADC1, and data WDATA4 that information processing device CHIP0 has just written to memory bank BANK4 are read (Read from Bank4).

The data that have been read from memory bank BANK4 are transmitted to buffer DBF1 and supplied from input/output signal I/O1.

In addition, by means of this read command Read, status notification signal SIG0 becomes "High," and notification that read command Read from information processing device CHIP1 is being executed is sent to information processing device CHIP0. A status signal relating to this read request (read command Read, memory bank BANK4, column address 32, and a completion time of 5 cycles indicating that the operation will be completed after five cycles) is supplied from input/output signal I/O0. After output of this status signal from input/output signal I/O0, signal SIG0 becomes "Low."

Information processing device CHIP0 saves the status signal from this input/output signal I/O0 to its own memory control circuit MCON0 and is thus able to acquire the actual content of the request that information processing device CHIP1 is executing in multiport memory MPMEM2. In other words, information processing device CHIP0 is able to know the completion time of read command Read from information processing device CHIP1.

By means of the status signal from input/output signal I/O0, information processing device CHIP0 applies write command Write, bank address Bank4, and column address Col64 through signal DADC0 and applies write data WDATA4 from input/output signal I/O0 to multiport memory MPMEM2 in synchronization with clock CLK immediately after completion of the read operation from information processing device CHIP1.

Memory bank BANK4, which is a shared area, is selected by means of write command Write, bank address Bank4, and column address Col64 that are received as input. Write data WDATA4 are written to memory bank BANK4 through buffer DBF0.

As described hereinabove, by means of the status signals from input/output signals I/O0 and I/O1, information processing devices CHIP0 and CHIP1 are able to know the actual content (command, memory bank, address, completion time) of requests being executed by each, and as a result, data communication between information processing devices CHIP0 and CHIP1 can be carried out at high speed.

Although explanation was made in regard to an example in which the multiport memory has two ports, the same effect can be realized for a multiport memory having three or more ports. Regarding each of the registers shown in FIGS. 7-10 and FIGS. 21-24 in such cases, the number of bits should be increased according to the number of ports that are provided.

In this case, as shown in FIG. 30, the bits that correspond to port 0 (PRT0) and port 1 (PRT1) can be set to "1" and the bits that correspond to port 2 (PRT2) and port 3 (PRT3) can be set to "0" in master register MS-RG shown in FIG. 8. When these settings are adopted, the access to port 0 (PRT0) and port 1 (PRT1) is given priority over the access to port 2 (PRT2) and port 3 (PRT3), and arbitration between port 0 (PRT0) and port 1 (PRT1) and arbitration between port 2 (PRT2) and port 3 (PRT3) can follow a round-robin mode. Still further, the number of bits in status register ST-RG shown in FIG. 9 may also be increased in accordance with the number of ports provided.

In addition, FIG. 31 shows an example of a register in which a four-port configuration is adopted for master register DMS-RG shown in FIG. 22. The process of prioritizing requests is similar to that of FIG. 30 and settings relating to refresh operations may be carried out for each port.

In addition, the present invention is open to various modifications that do not depart from the gist of the present invention. For example, although explanation in the embodiments was made in regard to examples in which the completion time at which a next command can be applied to the same memory area was used as the information that is notified to other ports, this information may also be the execution time of the request to the memory area.

SUMMARY OF THE EFFECTS OF THE INVENTION DESCRIBED IN THE EMBODIMENTS

The chief effects that are obtained by the invention disclosed in the specification as described hereinabove are as follows:

In an information processing system made up of a multiport memory and a plurality of information processing devices that are connected to this multiport memory, among memory areas in the multiport memory, memory areas that are shared by a plurality of ports and memory areas that are occupied by a single port can be altered to enable flexible response to requests of the information processing system.

Still further, the plurality of information processing devices that are connected to the multiport memory can learn the actual content of requests (commands, memory banks, addresses, and completion times) that are being executed by other information processing devices by means of status signals from input/output signals I/O0 and I/O1 to enable high-speed data communication between the information processing devices.

As a result, a multiport memory can be realized that allows an increase in the speed of data communication between the plurality of information processing devices that make up the information processing system, and an information processing system can be provided that features high speed and ease of use.

It is apparent that the present invention is not limited to the above embodiments, but may be modified and changed without departing from the scope and spirit of the invention.

What is claimed is:

1. An information processing system that includes a multiport memory having a plurality of ports and a plurality of information processing devices each connected to an associated one of said plurality of ports of said multiport memory, wherein said multiport memory comprises:
    a first control circuit that receives a request through a first port of said plurality of ports;
    a memory circuit that performs an operation responsive to said request; and
    a second control circuit that supplies, during performing said operation by said memory circuit, a content of said request to a second port of said plurality of ports.

2. The information processing system according to claim 1, wherein said multiport memory includes a register in which said content of said request supplied from said second port is set.

3. The information processing system according to claim 2, wherein said register is programmed by a first one of said information processing devices that is connected to said first port.

4. The information processing system according to claim 3, wherein, in said multiport memory, the content of said register that is programmed from said first port is read by a second one of said information processing devices that is connected to said second port.

5. The information processing system according to claim 2, wherein said register is further used to be programmed by one of said information processing devices that is connected to said second port.

6. The information processing system according to claim 1, wherein the content of said request that is supplied from said second port is saved in one of the said information processing devices that is connected to said second port.

7. The information processing system according to claim 1, wherein said multiport memory has a plurality of memory areas, and each of said plurality of memory areas is programmed with information indicative of whether or not said request from said first port is to be supplied from said second port.

8. The information processing system according to claim 1, wherein said content of said request supplied from said second port includes time interval information of said request.

9. The information processing system according to claim 1, wherein said content of said request supplied from said second port includes address information of said request.

10. A multiport memory having a plurality of ports, comprising:
    a first control circuit that receives a request through a first port of said plurality of ports;
    a memory circuit that performs an operation responsive to said request; and
    a second control circuit that supplies, during performing said operation by said memory circuit, a content of said request to a second port of said plurality of ports.

11. The multiport memory according to claim 10, further comprising a register in which is set said content of said request supplied from said second port.

12. The multiport memory according to claim 11, wherein said register is programmed by a first information processing device that is connected to said first port.

13. The multiport memory according to claim 12, wherein said content of said register that is programmed from said first port is read from said second port.

14. The multiport memory according to claim 10, wherein said register is further used to be programmed by an information processing device that is connected to said second port.

15. The multiport memory according to claim 10, wherein said content of said request that is supplied from said second port is saved by an information processing device that is connected to said second port.

16. The multiport memory according to claim 10, wherein said multiport memory has a plurality of memory areas, and each of said plurality of memory areas is programmed with information indicative of whether or not said request from said first port is to be supplied from said second port.

17. The multiport memory according to claim 10, wherein said content of said request from said second port includes time interval information of said request.

18. The multiport memory according to claim 10, wherein the content of said request that is supplied from said second port includes address information of said request.

* * * * *